(12) United States Patent
Toba et al.

(10) Patent No.: US 12,349,473 B2
(45) Date of Patent: Jul. 1, 2025

(54) ULTRAVIOLET LIGHT RECEIVING DEVICE

(71) Applicants: DOWA HOLDINGS Co., Ltd., Tokyo (JP); DOWA Electronics Materials Co., Ltd., Tokyo (JP)

(72) Inventors: Ryuichi Toba, Sendai (JP); Yasuhiro Watanabe, Akita (JP)

(73) Assignees: DOWA HOLDINGS Co., Ltd., Tokyo (JP); DOWA Electronics Materials Co., Ltd., Tokyo (JP)

( * ) Notice: Subject to any disclaimer, the term of this patent is extended or adjusted under 35 U.S.C. 154(b) by 442 days.

(21) Appl. No.: 17/759,040

(22) PCT Filed: Jan. 15, 2021

(86) PCT No.: PCT/JP2021/001353
§ 371 (c)(1),
(2) Date: Jul. 19, 2022

(87) PCT Pub. No.: WO2021/149623
PCT Pub. Date: Jul. 29, 2021

(65) Prior Publication Data
US 2023/0040765 A1    Feb. 9, 2023

(30) Foreign Application Priority Data

Jan. 20, 2020    (JP) .................................. 2020-007028

(51) Int. Cl.
*H10F 30/227*    (2025.01)
*H10F 77/124*    (2025.01)
*H10F 77/20*    (2025.01)

(52) U.S. Cl.
CPC ....... *H10F 30/227* (2025.01); *H10F 77/1248* (2025.01); *H10F 77/206* (2025.01)

(58) Field of Classification Search
CPC ........... H01L 31/108; H01L 31/022408; H01L 31/03046; H10F 30/227; H10F 77/1248; H10F 77/206
See application file for complete search history.

(56) References Cited

U.S. PATENT DOCUMENTS 5,278,435 A * 1/1994 Van Hove ............... H10F 77/20
                                                    257/E31.022
6,104,074 A    8/2000 Chen
2019/0341536 A1* 11/2019 Choi ..................... H01L 33/502

FOREIGN PATENT DOCUMENTS

JP    2002083996 A    3/2002
JP    2004039913 A    2/2004
(Continued)

OTHER PUBLICATIONS

J. L. Pau, C. Rivera, J. Pereiro, A. Navarro and E. Munoz, "Ultraviolet and visible nitride photodetectors: applications," Conference on Electron Devices, 2005 Spanish, Tarragona, Spain, 2005, pp. 7-10, doi: 10.1109/SCED.2005.1504291 (Year: 2005).*

(Continued)

*Primary Examiner* — Sitaramarao S Yechuri
(74) *Attorney, Agent, or Firm* — KENJA IP LAW PC

(57) ABSTRACT

Provided is an ultraviolet light receiving device having photosensitivity effective to target wavelengths in the ultraviolet region. A Schottky junction ultraviolet light receiving device has the photosensitivity peak wavelength in an ultraviolet region of 230 nm or more and 320 nm or less, and exhibits a rejection ratio of $10^5$ or more, the rejection ratio being the ratio of the responsivity Rp to the peak photosensitivity wavelength to the average of the responsivity Rv to a visible region of 400 nm or more and 680 nm or less (Rp/Rv).

2 Claims, 14 Drawing Sheets

(56) References Cited

FOREIGN PATENT DOCUMENTS

JP          2004288925 A  * 10/2004
JP          2019110168 A    7/2019

OTHER PUBLICATIONS

Jul. 26, 2022, International Preliminary Report on Patentability issued in the International Patent Application No. PCT/JP2021/001353.
E. Monroy et al., Analysis and modeling of AlxGa1—xN-based Schottky barrier photodiodes, Journal of Applied Physics, Aug. 2000, pp. 2081-2091, vol. 88, No. 4.
Hirano Hikaru et al., Application of GaN-based light receiving elements to flame sensors, Applied Physics, 1999, pp. 805-809, vol. 68 , No. 7.
Mar. 30, 2021, International Search Report issued in the International Patent Application No. PCT/JP2021/001353.
Dec. 19, 2023, Notification of Reasons for Refusal issued by the Japan Patent Office in the corresponding Japanese Patent Application No. 2020-007028.

* cited by examiner

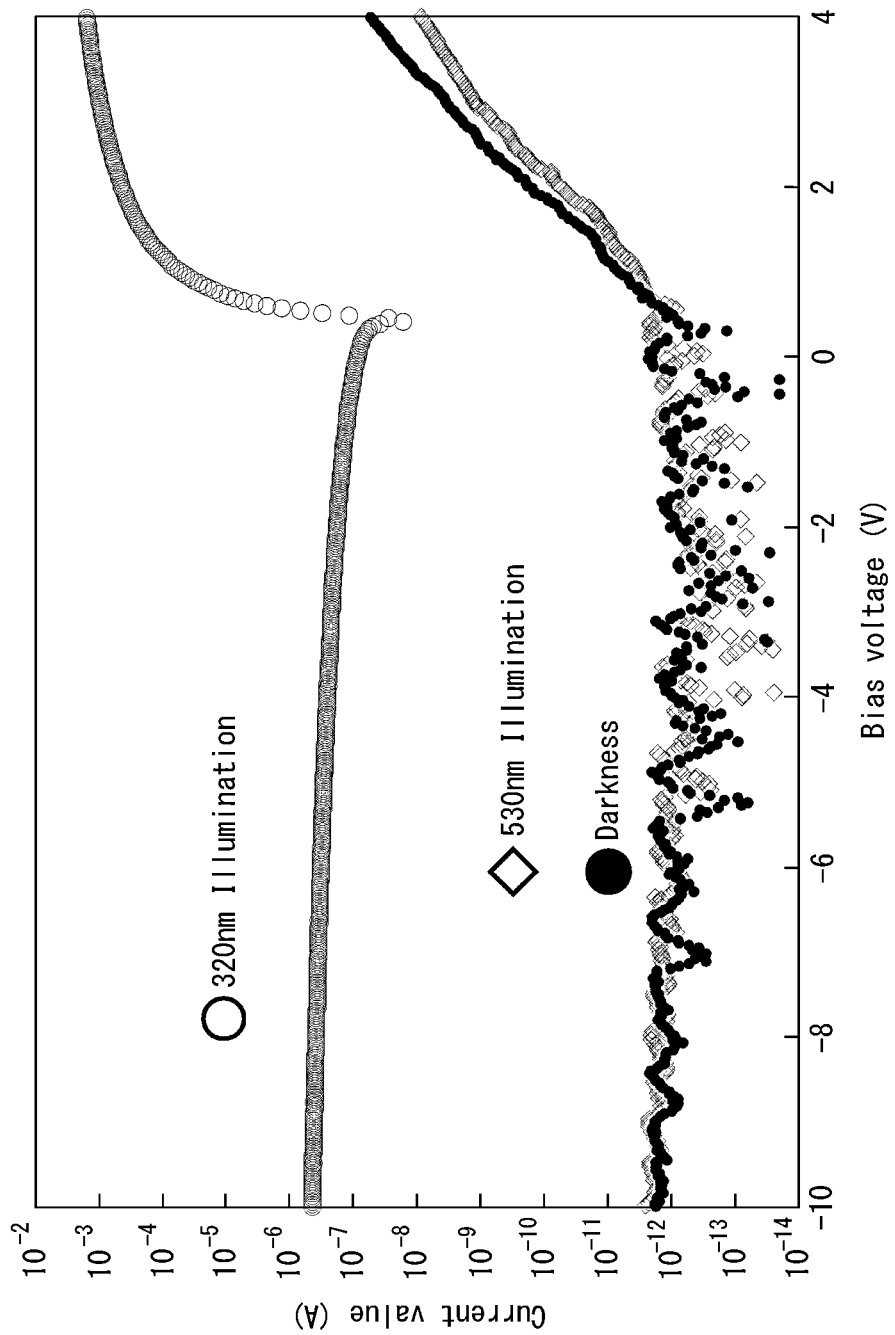

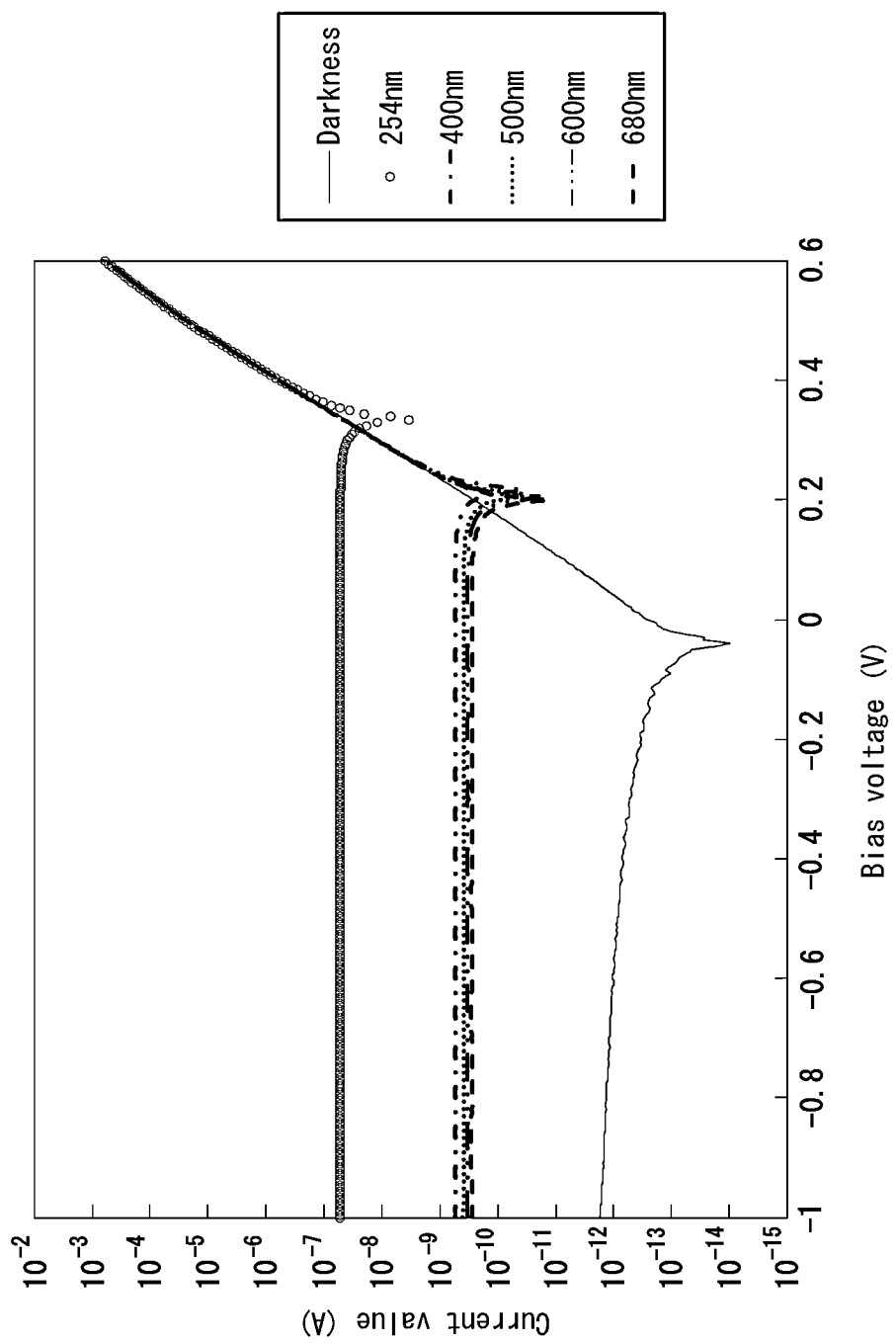

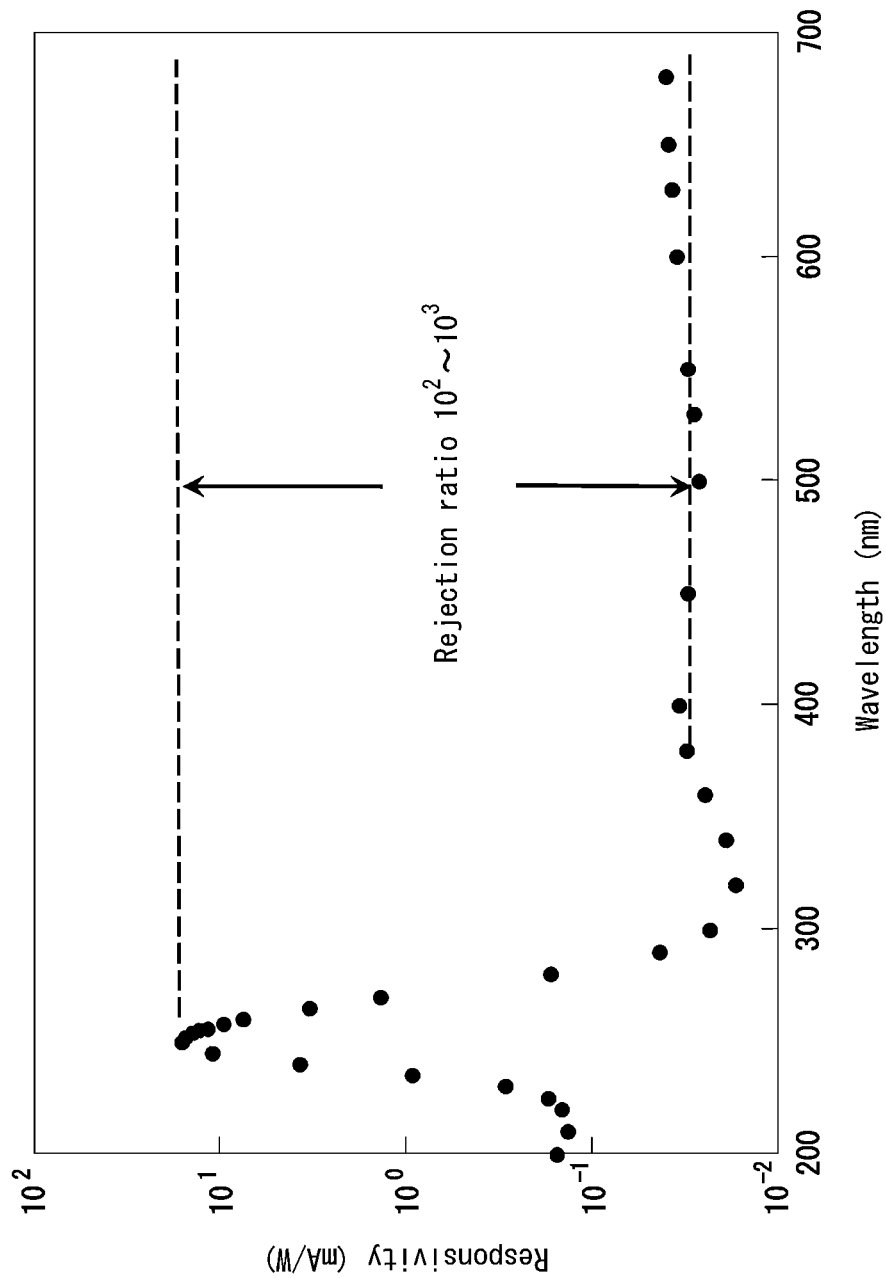

ULTRAVIOLET LIGHT RECEIVING DEVICE

TECHNICAL FIELD

This disclosure relates to an ultraviolet light receiving device, and particularly relates to an ultraviolet light receiving device that has photosensitivity effective to certain wavelengths of ultraviolet light without being disturbed by outdoor light or indoor light.

BACKGROUND

The ultraviolet region (200 nm to 400 nm) is applied to various types of industrial technologies. For example, examples of various applications known include curing of photosensitive resins, sensing in various types of analyses, disinfection, and treatment on human skin. The light source for ultraviolet light depends on the wavelength range. Low-pressure mercury-vapor lamps (emission line at 254 nm) are used in disinfection applications, medium/high-pressure mercury-vapor lamps (emission line between 200 nm to 600 nm) are used in resin curing applications, and ultraviolet light obtained by dispersing light from a xenon lamp or deuterium lamp light source is used in analytical instrument applications. Further, as light sources for the ultraviolet region, in addition to the above conventional mercury-vapor lamps, deuterium lamps, and xenon lamps; monochromatic light sources such as light emitting diodes (LEDs) and laser diodes (LDs) have been developed.

Considering the effect of ultraviolet light on the human body, since ultraviolet light has a detrimental effect particularly on human eyes and skin, when applying ultraviolet light to industrial technologies, safety measures for example for leakage of the ultraviolet light into the surroundings are unavoidable. For example, wavelengths around 265 nm are known to have the highest disinfection efficiency, and DNA absorbs light of the wavelengths and is disrupted. The risk of skin cancer is considered to be particularly increased by exposure to radiation in the short wavelength region. On the other hand, ultraviolet light around 310 nm is specifically needed for the production of vitamin D and is also applied to treatments on skin.

Further, in the applications to bio related technologies, ultraviolet absorption is used to assess the purity of DNA and RNA in some cases. For example, when the ratio of the absorbances at wavelengths of 260 nm and 280 nm ($A_{260}/A_{280}$) is 1.8 or more, the purity of DNA is determined to be high, whereas when the ratio is 2.0 or more, the purity of RNA is determined to be high. Further, the ratio of the absorbances at 260 nm and 230 nm ($A_{260}/A_{230}$) should normally be 2.0 to 2.2 when DNA or RNA has high purity. If the ratio is smaller than the range, it is suggested that organic materials that absorb light of 230 nm should have mixed in. For those measurements, an ultraviolet spectrophotometer is typically used.

As described above, ultraviolet light is used in various applications. When ultraviolet light is used, the quantity of ultraviolet light needs to be measured and assessed and needs to be controlled based on feedback, so that the device on the light receiving side is also important as a companion to the ultraviolet light source side.

Si, a semiconductor, is used in a wide variety of applications, and is also used in light receiving devices. Since the semiconductor Si has a forbidden band width (band gap) of 1.12 eV, a light receiving device using a Si material has photosensitivity to an ultraviolet region to a near infrared region (approximately 200 nm to 1100 nm). On the other hand, when the semiconductor Si is used in light receiving devices, light other than the light intended to be detected, if any, is also detected in addition. In the applications where light other than the light intended to be detected causes disturbance, measures for blocking light of unnecessary wavelength components, for example, need to be taken.

In contrast, since III-nitrides are wide-bandgap semiconductors, their applications to flame sensors have been studied in the expectation that the photosensitivity mainly to the ultraviolet region could be obtained. A. Hirano, et al., "Application of GaN-based Photodetector to Flame detection", OYO BUTURI, Vol. 68, No. 7, 1999, p. 805 (in Japanese)(NPL 1) suggests that 250 nm to 280 nm are preferably used as wavelengths for flame detection, since ultraviolet light of 280 nm or less does not reach the ground because sunlight is absorbed by the ozone layer. NPL 1 describes that in that case, the ratio of the peak responsivity to ultraviolet light of a specific wavelength that is intended to be detected to the responsivity to light other than the light intended to be detected, causing disturbance (hereinafter referred to as "rejection ratio") is preferably approximately $10^6$. A high rejection ratio is required for sensors used to detect specific wavelengths, for example to detect a flame. NPL 1 gives characteristic values of a reported case when a nitride semiconductor is used; however, the rejection ratio is limited to a range of approximately $10^4$ or less.

E. Monroy, et al., "Analysis and modeling of $Al_xGa_{1-x}N$-based Schottky barrier photodiodes", Journal of Applied Physics, Vol. 88, No. 4, August 2000, pp. 2081-2091 (NPL 2) reports a Schottky light receiving device using an AlGaN mixed crystal and suggests that Schottky light receiving devices have an advantage over p-n and p-i-n devices when used as broadband UV detectors. Note that a Schottky light receiving device has a structure in which a junction of a very thin metal layer (Au (gold) etc.) with an n-type semiconductor layer is formed instead of a junction of a p-type semiconductor layer therewith, which is different from the structure of p-n or p-i-n devices. In NPL 2, a semitransparent Au (100 angstrom) contact is used as a Schottky electrode, and illumination is through the semitransparent electrode (see FIG. 3 in NPL 2). The spectral responsivity in the case where the Al composition ratio x in an $Al_xGa_{1-x}N$ light receiving layer is changed to adjust the photosensitivity band is given in FIG. 8 of NPL 2. The responsivity is constant at wavelengths shorter than the cutoff wavelength; however, the ratio between the ultraviolet photoresponsivity and the visible photoresponsivity, that is, the rejection ratio is found to be $10^3$ to $10^4$ (described as being higher than $10^3$ in the text). Note that only the data for wavelengths of 400 nm to 475 nm are provided for the visible region. For a device with a cutoff at around 300 nm, the values can be read for 350 nm or less, and the rejection ratio to the visible light region cannot be determined.

CITATION LIST

Non-Patent Literature

NPL 1: A. Hirano, et al., "Application of GaN-based photodetector to flame detection", OYO BUTURI, Vol. 68, No. 7, 1999, p. 805 (in Japanese)

NPL 2: E. Monroy, et al., "Analysis and modeling of $Al_xGa_{1-x}N$-based Schottky barrier photodiodes", Journal of Applied Physics, Vol. 88, No. 4, August 2000, pp. 2081-2091

SUMMARY

Technical Problem

Conventionally, for an output monitor for a specific ultraviolet wavelength, for example, for a mercury-vapor lamp (254 nm), to block light of wavelengths other than the specific wavelength, a band-pass interference filter is attached to a package window of a Si light receiving device (for example, Si photodiode: S12742-254 manufactured by HAMAMATSU PHOTONICS K.K.). However, the blockage by an interference filter insufficiently reduces light in the visible light region, the ratio of the responsivity to 254 nm and the responsivity to the near ultraviolet to visible light region (rejection ratio) is limited to the order of $10^2$. Accordingly, when the visible light intensity is high, disturbance is hardly avoided. Further, the attachment of the filter also reduces the photosensitivity to ultraviolet light that is intended to be detected.

When a monochromatic light source and a light receiving device side that responds to a specific wavelength are used in pair, a spectrometer is not necessary and a simple evaluation system can be built. In addition to the above-described biomedical applications, in disinfection applications and skin treatment applications, ultraviolet light quantity monitoring, feedback control, and detection of ultraviolet leakage into the surroundings are necessary, so that there is a demand for a device which not only has an increased rejection ratio, but also has high photosensitivity to a specific wavelength in the ultraviolet region.

It could therefore be helpful to provide a Schottky ultraviolet light receiving device that has high photosensitivity (responsivity) to specific ultraviolet wavelengths and reduced photosensitivity (responsivity) to the other wavelengths, thus having a high rejection ratio to reduce disturbance.

Solution to Problem

In order to achieve the above objective, the present inventors studied methods of reducing the responsivity to light in the visible light region by appropriately determining the direction of ultraviolet light entering a light receiving device, by using a structure by which the wavelengths of the light reaching a light receiving layer are selected, and by improving the crystallinity of the light receiving layer. Specifically, this disclosure primarily includes the following features.

(1) A Schottky ultraviolet light receiving device configured to have a peak photosensitivity wavelength in an ultraviolet region of 230 nm or more and 320 nm or less,
wherein a rejection ratio that is a ratio of a responsivity Rp to the peak photosensitivity wavelength to an average of responsivity Rv to a visible region of 400 nm or more and 680 nm or less (Rp/Rv) is $10^5$ or more.

(2) The ultraviolet light receiving device according to (1) above, comprising an AlN layer on a sapphire substrate and an AlGaN laminate made up of a plurality of AlGaN layers having different Al composition ratios on the AlN layer,
wherein illumination light for measuring the responsivity enters through the sapphire substrate.

(3) The ultraviolet light receiving device according to (1) or (2) above,
wherein a half width of a photosensitivity spectrum of the ultraviolet light receiving device is 40 nm or less.

(4) The ultraviolet light receiving device according to (2) or (3) above,
wherein the AlGaN laminate has an $Al_wGa_{1-w}N$ buffer layer (0.5≤w≤0.95) and an $Al_zGa_{1-z}N$ light receiving layer in this order from the AlN layer side, and
the values of the Al composition ratios satisfy a relationship of z<w.

(5) The ultraviolet light receiving device according to (4) above,
wherein the AlGaN laminate has an n-type $Al_xGa_{1-x}N$ current spreading layer and an n-type $Al_yGa_{1-y}N$ ohmic contact layer in this order from the AlN layer side between the $Al_wGa_{1-w}N$ buffer layer and the $Al_zGa_{1-z}N$ light receiving layer, and
the values of the Al composition ratios satisfy a relationship of z≤y<x≤w.

(6) The ultraviolet light receiving device according to (5) above,
wherein the $Al_zGa_{1-z}N$ light receiving layer has an etched portion where the n-type $Al_yGa_{1-y}N$ ohmic contact layer is exposed,
an n-type ohmic electrode is provided on the exposed n-type $Al_yGa_{1-y}N$ ohmic contact layer, and
a Schottky electrode is placed on the $Al_zGa_{1-z}N$ light receiving layer.

Advantageous Effect

This disclosure can provide a Schottky ultraviolet light receiving device that has a photosensitivity peak at a specific wavelength in the ultraviolet region and has a high rejection ratio with respect to visible light.

BRIEF DESCRIPTION OF THE DRAWINGS

In the accompanying drawings:

FIG. 6 is a graph presenting the I-V characteristics of an ultraviolet light receiving device (having a photosensitivity peak at a wavelength of 320 nm) in Example 2;

FIG. 10 is a graph presenting the photocurrent-voltage characteristics of a Si light receiving device that detects light of a specific wavelength range in the ultraviolet region using a band-pass filter according to Comparative Example 1;

FIG. 11 is a semi-log graph of the wavelength dependence of the responsivity for presenting the rejection ratio of the Si light receiving device that detects light of a specific wavelength range in the ultraviolet region using a band-pass filter according to Comparative Example 1 with respect to a visible light region;

DETAILED DESCRIPTION

<Photosensitivity Peak Wavelength>

A Schottky ultraviolet light receiving device according to this disclosure is an ultraviolet light receiving device having a photosensitivity peak wavelength $\lambda p$ in an ultraviolet region of 230 nm or more and 320 nm or less. The photosensitivity peak wavelength $\lambda p$ will now be described. When light of a certain wavelength $\lambda$ (nm) in a wavelength range of 200 nm to 680 nm is emitted at a light intensity Q (W), the value of the photocurrent flowing through the light receiving device at a bias of 0 V is I (A). When the horizontal axis represents the wavelength $\lambda$ and the vertical axis represents the responsivity R=I/Q (A/W) that is a value obtained by dividing the light intensity Q (W) by the photocurrent value I (A), the wavelength at a measurement point at which the value of the responsivity R takes the maximum maximal value (maximum value of responsivity: Rp) is the photosensitivity peak wavelength $\lambda p$. The measurement wavelength interval $\Delta\lambda$ here is 10 nm or less.

<Rejection Ratio>

For a Schottky ultraviolet light receiving device according to this disclosure, Rp/Rv that is the ratio of the responsivity Rp at the photosensitivity peak wavelength in an ultraviolet region of 230 nm or more and 320 nm or less (the maximum value of responsivity) and the average responsivity Rv to a visible region of 400 nm or more and 680 nm or less (hereinafter referred to as "rejection ratio") is $10^5$ or more.

Further, the ultraviolet light receiving device according to this disclosure has an AlN layer and an AlGaN laminate made up of a plurality of AlGaN layers having different Al composition ratios in this order on a sapphire substrate, and illumination light for measuring the responsivity preferably enters from the sapphire substrate side. In this AlGaN laminate, compared with AlGaN layers on the AlN layer side, AlGaN layers on the opposite side of the sapphire substrate preferably have a lower Al composition ratio. In the AlGaN laminate, an AlGaN layer having a lower Al composition ratio that is placed on the opposite side of the sapphire substrate is preferably a light receiving layer.

(Dependence of Spectral Transmittance on Al Composition Ratio)

Figure 1:
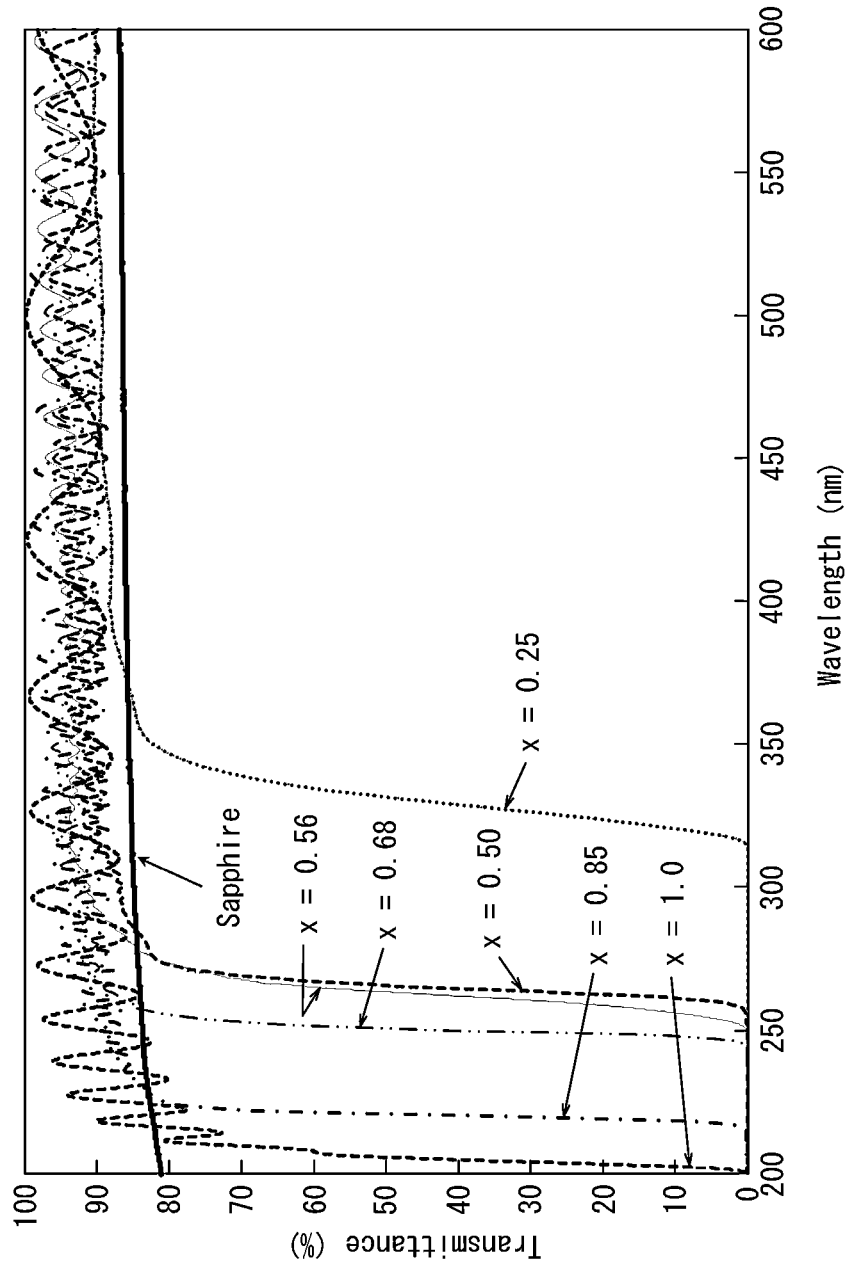
FIG. 1 is a graph illustrating the dependence of the transmittance of an $Al_xGa_{1-x}N$ layer on a sapphire substrate on the Al composition ratio x according to the studies by the present inventors.

Now, the origin of the idea of this disclosure will be described. FIG. 1 presents the dependence of the spectral transmittance measured by the present inventors on the Al composition ratio x. An AlN layer with a thickness of 1000 nm was grown on a c-plane sapphire substrate by MOCVD, and a 1000 nm undoped $Al_xGa_{1-x}N$ layer was grown to prepare an epitaxial substrate. Total six such samples were prepared in which the Al composition ratio x of the undoped $Al_xGa_{1-x}N$ layer was 0.25, 0.50, 0.56, 0.68, 0.85, and 1.0 (AlN when the Al composition ratio was 1.0) as given in the graph of FIG. 1. The transmittance of the samples having the undoped $Al_xGa_{1-x}N$ layers with different Al composition ratios x was measured using an ultraviolet-visible (UV-VIS) spectrophotometer (model: U-3900) manufactured by Hitachi High-Tech Science Corporation with reference to the transmittance of a double-side mirror-polished sapphire substrate as a baseline. Note that the data of the transmittance of the sapphire substrate are also included in FIG. 1; however, the data used the atmosphere as a reference. The sapphire substrate has a transmittance of 80% or more to the entire range from 200 nm to 600 nm. Referring to FIG. 1, the rising edge of the transmittance is found to be on the longer wavelength side in order from the higher Al composition ratio side (x=1.0) to the lower Al composition ratio side (x=0.25).

A study is made of a light receiving device provided with an AlGaN laminate having a laminate structure in which the Al composition ratios x of $Al_xGa_{1-x}N$ layers on a sapphire substrate are sequentially reduced (compared with layers on the AlN layer side in the AlGaN laminate, layers on the opposite side of the sapphire substrate have a lower Al composition ratio) and a Schottky electrode on the AlGaN laminate. When light enters from the sapphire substrate side, light of short wavelengths is absorbed and cut by the AlGaN layers having an Al composition ratio higher than the Al composition ratio of the light receiving layer. For example, when the Al composition ratio of the light receiving layer is 0.56, and an AlGaN layer having an Al composition ratio of 0.85 is placed closer to the sapphire substrate (AlN layer) than to the light receiving layer, the photosensitivity peak can be found between approximately 220 nm to approximately 250 nm. The present inventors considered that photosensitivity to a narrow wavelength range can be achieved by sequentially stacking AlGaN layers having different Al composition ratios on a sapphire substrate as described above.

(Comparison in Relation to Direction of Entry of Detection Light)

On the other hand, they considered a case where light enters an epitaxial substrate having an AlGaN laminate with the same composition and the same structure through the surface of the AlGaN laminate and not from the sapphire substrate side. In this case, the transmittance characteristics of the device is similar to those of a layer having a low Al composition ratio in the AlGaN laminate (for example, a light receiving layer). For example, when the Al composition ratio of the AlGaN layer is 0.25, the device has photosensitivity to a wide wavelength range in short wavelengths of approximately 320 nm or less. In this case, there is only the Schottky electrode between the incident light and the light receiving layer. It should be noted that since detection light needs to be guided to the light receiving layer through the Schottky electrode, the Schottky electrode necessarily has a structure allowing the light to be guided to the light receiving layer by a method in which an extremely thin semitransparent electrode is used or the electrode is partly cut out.

Unlike the case where light enters through the surface of the AlGaN laminate, when light enters from the sapphire substrate side, a sufficiently large light receiving area can be ensured, and light reaches a layer having a low Al composition ratio in the AlGaN laminate (for example, the light receiving layer) through AlGaN layers having a higher Al composition ratio than the light receiving layer as well as the sapphire substrate. Thus, light of shorter wavelengths can be filtered out, thus the device can have photosensitivity only to a narrow range in the ultraviolet region. When light enters from the Schottky electrode material side, the removal of light of wavelengths shorter than a target wavelength range in the ultraviolet region by filtering is considered to be substantially impossible unlike the case where light enters from the sapphire substrate side.

<Half Width>

For an ultraviolet light receiving device according to this disclosure, the half width (FWHM) of the photosensitive spectrum is preferably 40 nm or less. When the horizontal axis represents the wavelength $\lambda$ and the vertical axis represents the responsivity R=I/Q (A/W) found by dividing the photocurrent value I (A) by the light intensity Q (W), the photosensitivity spectrum is displayed as straight lines connecting the measurement points. The half width of a photosensitivity spectrum is the width between the wavelengths at which the responsivity is half the maximum value of the responsivity at the photosensitivity peak in an ultraviolet region of 230 nm or more and 320 nm or less, found from the above photosensitivity spectrum.

With a laminate structure for which light enters from the sapphire substrate side and the Al composition ratios x of the $Al_xGa_{1-x}N$ layers on the sapphire substrate are sequentially lower, photosensitivity to a narrow wavelength range can be achieved by filtering out light of shorter wavelengths; accordingly, an appropriate combination of the Al composition ratios x can make the half width of the photosensitivity spectrum to be 40 nm or less. In another preferred aspect, the photosensitivity spectrum has a spectral shape that is almost symmetric with respect to the photosensitivity peak. On the other hand, when light of shorter wavelengths is not filtered out as in the case where light enters through the Schottky electrode material, the photosensitivity spectrum greatly extends to the short wavelength side, thus the half width is greater than 40 nm. Moreover, the photosensitivity spectrum has an asymmetric spectral shape.

An example of an epitaxial substrate that can be used to fabricate an ultraviolet light receiving device according to this disclosure will now be described with reference to FIG. 2. For convenience of description, the Al composition ratios of the layers in the AlGaN laminate are hereinafter expressed as w, x, y, and z in this order from the sapphire substrate side. The epitaxial substrate depicted in FIG. 2 has an AlN layer 12 on a sapphire substrate 11, and has an $Al_wGa_{1-w}N$ buffer layer 13, an n-type $Al_xGa_{1-x}N$ current spreading layer 14, an n-type $Al_yGa_{1-y}N$ ohmic contact layer 15, and an $Al_zGa_{1-z}N$ light receiving layer 16 in this order on the AlN layer 12. The value of the Al composition ratio of each layer can be measured by a photoluminescence measurement and an X-ray diffraction measurement, and the thickness of each layer can be measured using a thickness measurement system using optical interferometry.

<Sapphire Substrate>

A commercially available sapphire substrate can be used, and its thickness may be for example 80 μm to 2000 μm. The standard thickness of currently commercially available ones is 430 μm for a diameter of 2 in, 650 μm for a diameter of 4 in, and 1000 μm to 1300 μm for a diameter of 6 in.

<AlN Layer>

The AlN layer 12 is preferably provided on the sapphire substrate 11. The thickness of the AlN layer 12 may be 0.3 μm to 3 μm. The half width (full width at half maximum: FWHM) for the (10-12) plane found by X-ray diffraction is preferably 500 s or less. Alternatively, an AlN template substrate in which an undoped AlN layer 12 is epitaxially grown on a surface of the sapphire substrate may be used. With a view to reducing the dislocation density of the AlN layer 12, annealing at 1500° C. or more may be performed.

<AlGaN Laminate>

The AlGaN laminate preferably has the $Al_wGa_{1-w}N$ buffer layer 13 (0.5≤w≤0.95) and the $Al_zGa_{1-z}N$ light receiving layer 16 in this order from the AlN layer side. In this case, the value of each Al composition ratio satisfies a relationship of z<w. Further, it is also preferred that the AlGaN laminate has the n-type $Al_xGa_{1-x}N$ current spreading layer 14 and the n-type $Al_yGa_{1-y}N$ ohmic contact layer 15 in this order from the AlN layer 12 side, between the $Al_wGa_{1-w}N$ buffer layer 13 and the $Al_zGa_{1-z}N$ light receiving layer 16. In this case, the AlGaN laminate has the $Al_wGa_{1-w}N$ buffer layer 13, the n-type $Al_xGa_{1-x}N$ current spreading layer 14, the n-type $Al_yGa_{1-y}N$ ohmic contact layer 15, and the $Al_zGa_{1-z}N$ light receiving layer 16 in this order from the AlN layer 12 side, and the value of the Al composition ratio of each layer in the AlGaN laminate preferably satisfies a relationship of z≤y<x≤w. A preferred aspect of each layer in the AlGaN laminate will now be described.

<<$Al_wGa_{1-w}N$ Buffer Layer>>

The $Al_wGa_{1-w}N$ buffer layer 13 is a layer that increases the crystallinity of the $Al_zGa_{1-z}N$ light receiving layer 16 by reducing lattice mismatch between the AlN layer 12 and the $Al_zGa_{1-z}N$ light receiving layer 16 and is a layer that filters out light of shorter wavelengths as described above. As given in FIG. 1, for an ultraviolet light receiving device having a photosensitivity peak wavelength in an ultraviolet region of 230 nm or more and 320 nm or less, an AlN layer is less effective as a layer for filtering light of shorter wavelengths, so that the Al composition ratio w preferably satisfies a range of $0.5 \leq w \leq 0.95$.

The thickness of the $Al_wGa_{1-w}N$ buffer layer 13 is preferably a thickness sufficient for increasing the crystallinity, may be appropriately set for example within a thickness range of 0.3 μm to 3 μm, and may be for example a thickness of 1 μm. The $Al_wGa_{1-w}N$ buffer layer 13 may be undoped or n-type doped; however, out of concern that the transmittance would be reduced when high levels of impurities are contained, the impurity concentration is preferably less than $1 \times 10^{17}$ cm$^{-3}$, and the layer is more preferably undoped. Being undoped here means being subjected to no deliberate impurity doping, and means that the concentration of impurities such as Si excluding unavoidable impurities is $4 \times 10^{16}$ cm$^{-3}$ or less.

<<n-Type $Al_xGa_{1-x}N$ Current Spreading Layer>>

The n-type $Al_xGa_{1-x}N$ current spreading layer 14 is a layer for aiding the transverse flow of currents in the n-type $Al_yGa_{1-y}N$ ohmic contact layer 15. Since the value of the Al composition ratio x is preferably equal to or lower than the Al composition ratio w of the $Al_wGa_{1-w}N$ buffer layer 13, when the n-type $Al_xGa_{1-x}N$ current spreading layer 14 is provided, its Al composition ratio x should satisfy $x \leq w$.

The thickness of the n-type $Al_xGa_{1-x}N$ current spreading layer 14 may be appropriately set within a range of 0.1 μm to 1 μm, and may be for example a thickness of 500 nm. The n-type dopant may use Si or Ge, and Si is preferably used. The n-type dopant concentration is preferably within a range of $5 \times 10^{17}$ cm$^{-3}$ to $2 \times 10^{19}$ cm$^{-3}$.

<<n-Type $Al_yGa_{1-y}N$ Ohmic Contact Layer>>

The n-type $Al_yGa_{1-y}N$ ohmic contact layer 15 is a layer for flowing currents by being connected to an ohmic electrode to be described below in detail. When the n-type $Al_yGa_{1-y}N$ ohmic contact layer 15 is provided, the value of the Al composition ratio y preferably has a relationship with the values of the Al composition ratios w and x: $y < x \leq w$.

The thickness of the n-type $Al_xGa_{1-x}N$ ohmic contact layer 15 may be appropriately set within a range of 0.1 μm to 1 μm, and may be for example a thickness of 200 nm. The n-type dopant may use Si or Ge, and Si is preferably used. The n-type dopant concentration is preferably within a range of $5 \times 10^{17}$ cm$^{-3}$ to $2 \times 10^{19}$ cm$^{-3}$.

<<$Al_zGa_{1-z}N$ Light Receiving Layer>>

The $Al_zGa_{1-z}N$ light receiving layer 16 is a layer that receives light and generates electricity. Carriers generated by light received can be extracted as currents with a Schottky electrode that is an extraction electrode and an ohmic electrode through the n-type $Al_yGa_{1-y}N$ ohmic contact layer. The value of the Al composition ratio z of the $Al_zGa_{1-z}N$ light receiving layer 16 preferably has a relationship with the values of the Al composition ratios w, x, and y: $z \leq y < x \leq w$.

The $Al_zGa_{1-z}N$ light receiving layer 16 may be undoped and may alternatively be deliberately n-type doped. The carrier concentration is preferably less than $1 \times 10^{17}$ cm$^{-3}$. The thickness of the $Al_zGa_{1-z}N$ receiving layer 16 may be appropriately set within a range of 0.1 μm to 1 μm, and may be for example a thickness of 300 nm.

<Electrode>

The shape of the electrode provided in the ultraviolet light receiving device according to this disclosure is not limited; for example, a Schottky electrode may be provided on the $Al_zGa_{1-z}N$ light receiving layer 16, and an n-type ohmic electrode may be provided on the n-type $Al_yGa_{1-y}N$ ohmic contact layer 15. In this case, the $Al_zGa_{1-z}N$ light receiving layer 16 has an etched portion in which the n-type $Al_yGa_{1-y}N$ ohmic contact layer 15 is exposed, and an n-type ohmic electrode can be provided on the exposed n-type $Al_yGa_{1-y}N$ ohmic contact layer 15.

In Examples to be described below, when an ultraviolet light receiving device is viewed from above, the shape of the Schottky electrode is circular, and the above Schottky electrode is placed in a circular hollow at the center of a rectangular n-type ohmic electrode; alternatively, the shape of the Schottky electrode may be rectangular, polygonal, etc. instead of being circular, and the shape of the n-type ohmic electrode may also be any given shape depending on the shape of the Schottky electrode.

(Example of Method of Producing Epitaxial Substrate)

The undoped AlN layer 12 is grown to approximately 1 μm on the c plane of the sapphire substrate 11 by MOCVD. The undoped $Al_wGa_{1-w}N$ buffer layer 13 having an Al composition ratio w within a range of $0.5 \leq w \leq 0.95$ is grown to for example approximately 1 μm on the AlN layer 12. Next, in order to reduce the resistance in the ultraviolet light receiving device in the transverse direction, the n-type $Al_xGa_{1-x}N$ current spreading layer 14 is grown to for example approximately 500 nm. The Al composition ratio x in this case satisfies $y \leq x \leq w$, and the n-type dopant is Si and may be added using for example a silane (SiH$_4$) gas diluted with hydrogen. Next, the n-type $Al_yGa_{1-y}N$ ohmic contact layer 15 is grown to for example approximately 200 nm. The Al composition ratio y in this case should satisfy $y \leq x$. Next, the undoped $Al_zGa_{1-z}N$ light receiving layer 16 is deposited to for example approximately 300 nm. The Al composition ratio z satisfies $z \leq y$. The composition of each AlGaN layer may be selected depending on the target photosensitivity range and photosensitivity peak wavelength, and at least a relationship of $z < x \leq w$ is preferably maintained. Examples of a raw material sources for epitaxially growing the layers, trimethylaluminum (TMA) may be used as an Al source, trimethylgallium (TMG) as a Ga source, and ammonia gas (NH$_3$) as a nitrogen source. For a carrier gas, for example hydrogen (H$_2$) may be used. The thickness of each layer in this example is by way of illustration, and the aforementioned thickness of each layer can be used.

Figure 2:
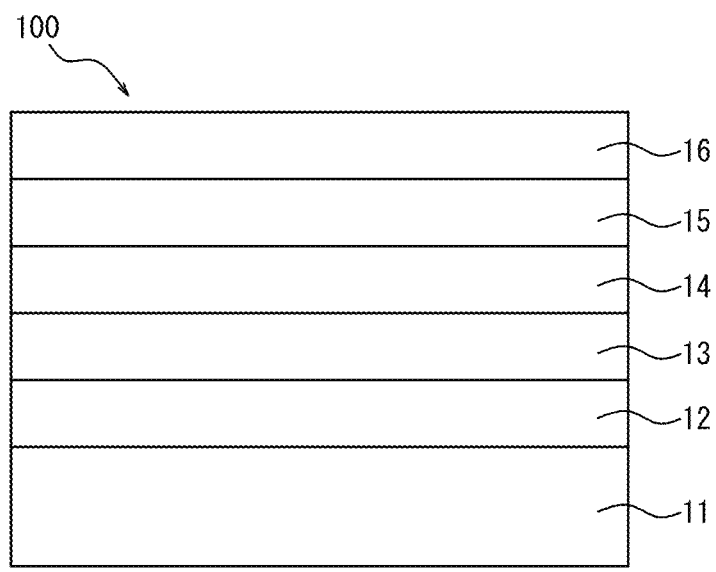
FIG. 2 is a schematic view of a cross-sectional structure of an epitaxial substrate having an AlGaN laminate which can be used in an ultraviolet light receiving device according to this disclosure.

A schematic view of a cross-sectional structure of an epitaxial substrate 100 provided with an AlGaN laminate that can be applied to this disclosure is depicted in FIG. 2 referred to above; an interlayer may be provided between each pair of adjacent layers in addition to the at least four AlGaN layers on the AlN layer 12. For example, the interlayer may be a composition graded layer or a controlled impurity concentration graded layer with which the difference between the composition ratios or the n-type dopant concentration of the layers is reduced. Alternatively, a layer having a composition ratio between the composition ratios of the adjacent layers or a layer having an impurity concentration between the impurity concentrations of the adjacent layers may be added.

(Example of Production Process of Ultraviolet Light Receiving Device)

Figure 3:
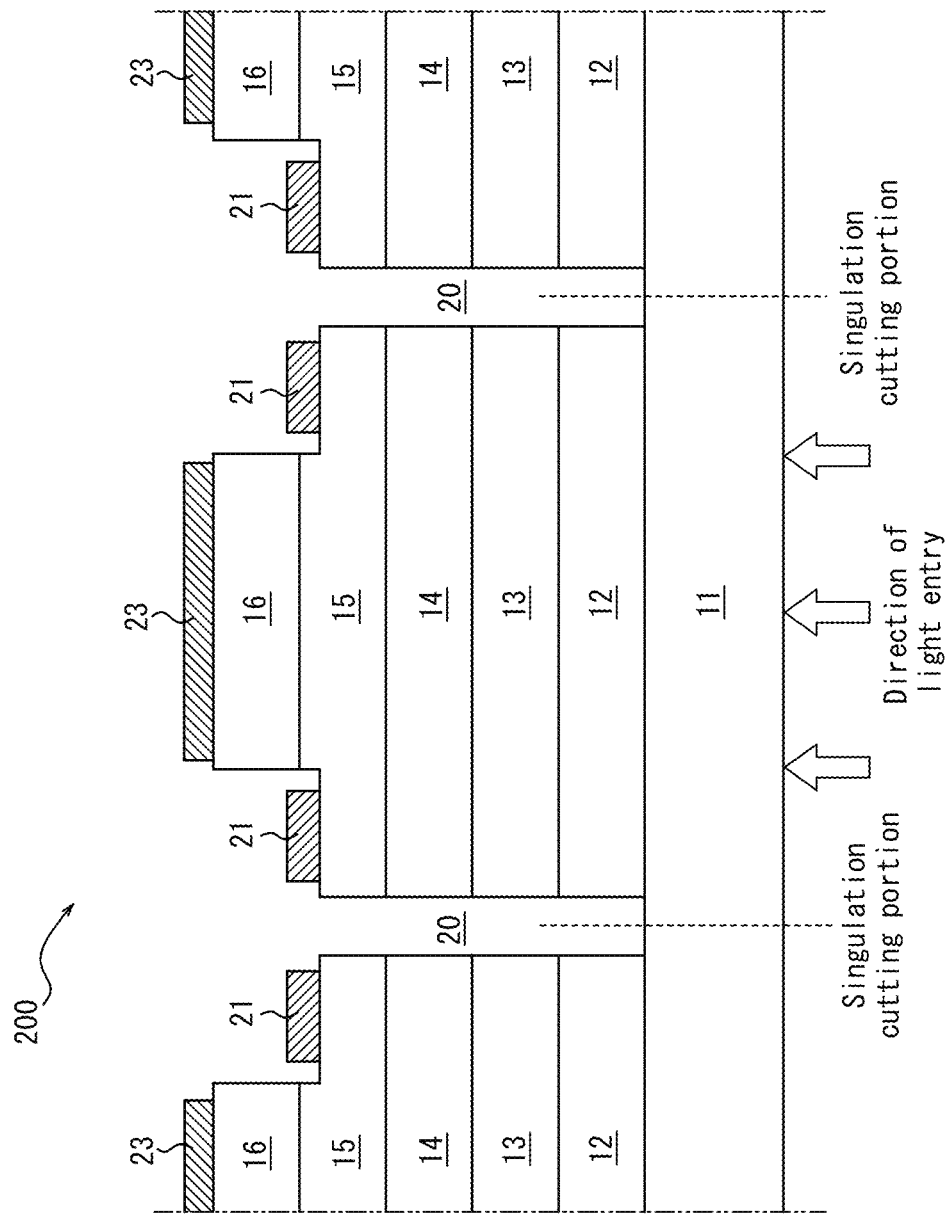
FIG. 3 is a schematic view of a cross-sectional structure of an ultraviolet light receiving device according to this disclosure.

FIG. 3 is a schematic view of a cross-sectional structure illustrating an example of the ultraviolet light receiving device according to this disclosure. An embodiment of a production method of obtaining devices by singulation of the epitaxial substrate 100 described above will be described. First, for the determination of dicing lines for the ultimate singulation and for an interim characteristics examination, processing is performed for providing isolation grooves 20 between the individual devices. To perform etching on the AlN layer and the epitaxial layers in the AlGaN laminate, and the sapphire substrate, dry etching using a chlorine-based gas is unavoidable. Accordingly, first, a pattern of a durable metal mask of for example Ni or Cr is formed on the epitaxial substrate 100. In this case, the above metal may be deposited to 500 nm or more by sputtering or vacuum deposition, followed by photolithography and etching, thus the pattern of the metal mask can be formed. Using the pattern of the metal mask formed as a mask, inductively coupled plasma (ICP) etching using a gas mixture of $BCl_3$ and $Cl_2$ and others, upper layers including at least the n-type $Al_xGa_{1-x}N$ current spreading layer 14 (the AlN layer 12 in FIG. 3) are removed at the portions to be provided with the isolation grooves 20. Next, a pattern of a metal mask for forming ohmic contact portions is formed on the $Al_zGa_{1-z}N$ light receiving layer 16 by photolithography and wet etching, and part of the $Al_zGa_{1-z}N$ light receiving layer 16 and part of the n-type $Al_xGa_{1-x}N$ ohmic contact layer 15 thereunder are removed by for example the dry etching described above, thereby forming the etched portions, thus, regions where the n-type $Al_xGa_{1-x}N$ ohmic contact layer 15 is exposed in the etched portions are formed. After removing the metal for dry etching for example by wet etching, openings where the ohmic electrodes are to be formed in the above exposed regions are formed by photolithography, a metal stack (for example Ti/Al) for n-type ohmic electrodes 21 is deposited by vacuum deposition or the like, and a pattern for the n-type ohmic electrodes 21 is formed by the lift-off process. The n-type ohmic contact electrodes 21 can be formed by performing heat treatment after that. Further, to form Schottky electrodes 23 on the surface of the $Al_zGa_{1-z}N$ light receiving layer 16, openings are formed by photolithography, and after depositing a Schottky metal by vacuum deposition or the like, the Schottky electrodes 23 are formed by lift-off. The Schottky metal may use Ni, Pd, Pt, Au, Ir, or the like that is a high work function material. Alternatively, a stack of these metals may be used. An interim electro-optic evaluation using a prober (a probing system for electrical characteristics evaluation) may be performed on devices in the wafer before being subjected to isolation by singulation. Subsequently, singulation is performed by various singulation methods (mechanical cutting, scribing and cutting, laser cutting, etc.).

EXAMPLES

The following provides a more detailed description of ultraviolet light receiving devices according to this disclosure using examples. However, this disclosure is not in any way limited by the following examples. First, an evaluation method for fabricated ultraviolet light receiving devices will be described.

(Evaluation Method for Photoelectric Characteristics of Light Receiving Device)

An evaluation of the electrical characteristics of a light receiving device was performed on a device in a wafer or a device obtained by singulation, and was performed by probing between the Schottky electrode and the ohmic electrode using a precision semiconductor parameter analyzer (4156C) manufactured by Agilent Technologies, Inc. The so-called I-V characteristics were evaluated by measuring the current values using a sweep voltage range of −20 V to +5 V. With a view to preventing electromagnetic noise and disturbance by indoor light, the measurement was performed in a dark shielding box. For the illumination direction, illumination was chiefly from the sapphire substrate side but for comparison, illumination from the Schottky electrode (epitaxial layer surface) side was also performed. For the illumination of samples, light from a 150 W xenon (Xe) light source (PS-X150) manufactured by JASCO Corporation was introduced into a spectrometer CT-25 manufactured by the same company through collector optics and optical filters both manufactured by the same company, the samples to be subjected to the evaluation was illuminated with the dispersed light through ultraviolet resistant UV-VIS optical fibers. Note that the illumination spot diameter on the sample surface was 1.2 mm, and the illumination light wavelength was in a range of 200 nm to 680 nm.

The absolute illumination power at the wavelengths was measured using two photosensors: PD300-UV manufactured by Ophir Optronics Solutions Ltd. and S2281 manufactured by HAMAMATSU PHOTONICS K.K., and it was determined that the absolute value error was up to a maximum of 10% in measurements for a wavelength range of 200 nm to 680 nm. Note that the responsivity at each wavelength is calculated by dividing the photocurrent value (A) by the illumination power (W) at a predetermined bias voltage, and thus is in A/W. When the rejection ratio as described above is determined, the quantity of illumination light of the visible light range is preferably larger. For the evaluation of the responsivity to a visible light range to which the sensitivity is low, measurements using three fiber-coupled LED light sources with center emission wavelengths of 455 nm, 530 nm, and 630 nm that have higher illumination power than spectroscopic light sources other than the spectroscopic light sources were performed to obtain reference data. The LED light sources allow for the illumination of the sample surface at approximately 6 mW at maximum by adjusting the supplied current.

Example 1

An ultraviolet light receiving device with a photosensitivity peak wavelength of 260 nm according to Example 1 was fabricated by MOCVD under the following epitaxial growth conditions. An undoped AlN (0001) epitaxial layer was grown to 800 nm on a c-plane sapphire substrate. Next, an undoped $Al_{0.70}Ga_{0.30}N$ layer (corresponding to the $Al_wGa_{1-w}N$ buffer layer) was grown to 1000 nm. Subsequently, a Si-doped n-type $Al_{0.68}Ga_{0.32}N$ layer (corresponding to the n-type $Al_xGa_{1-x}N$ current spreading layer) was grown to 500 nm, and a Si-doped n-type $Al_{0.50}Ga_{0.50}N$ layer (corresponding to the n-type $Al_yGa_{1-y}N$ ohmic contact layer) for forming ohmic contacts was then gown to 200 nm, and finally an undoped $Al_{0.50}Ga_{0.50}N$ layer (corresponding to the $Al_zGa_{1-z}N$ light receiving layer) was grown to 300 nm, thus an epitaxial substrate for a light receiving device was fabricated. When the chemical proportions of the AlGaN layers in the AlGaN laminate are expressed using the composition ratios (w, x, y, and z) as w=0.70, x=0.68, y=0.50, z=0.50. Next, in accordance with the example of a device production process of the ultraviolet light receiving device described above with reference to FIG. 3, an ultraviolet light receiving device with a device size of 2 mm (isolation groove width: 200 μm), including a Schottky electrode with a diameter of 1.6 mm at the device center and an n-type ohmic electrode around the Schottky electrode was fabricated. Ni was used as a metal for the Schottky electrode, and its thickness was 200 nm. Further, Ti/Al was used as a metal of the n-type ohmic electrode, and its total thickness was 210 nm. For the ultraviolet light receiving device obtained, the photocurrent-voltage (I-V) characteristics were measured for illuminations with different wavelengths from the sapphire substrate side, thus the responsivity to each wavelength was determined. In addition, LED light illumination was performed for the above three wavelengths in the visible region using fiber-coupled LED light sources, and the responsivity to each wavelength was also determined.

Figure 4:
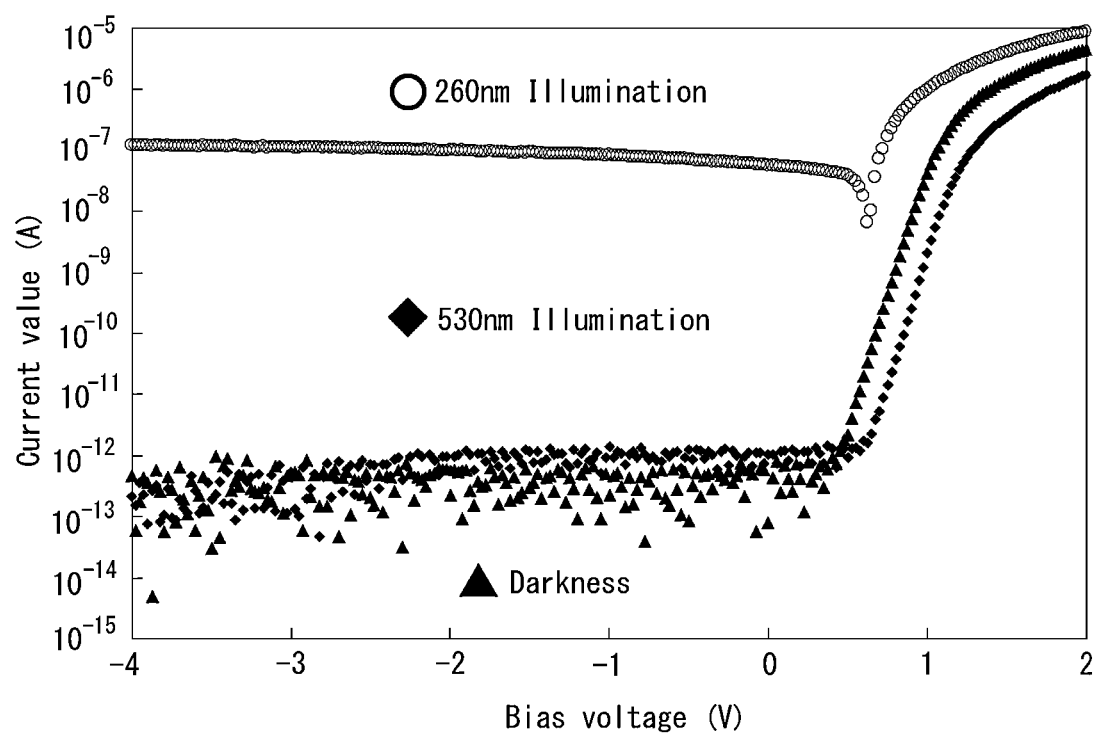
FIG. 4 is a graph presenting the I-V characteristics of an ultraviolet light receiving device (having a photosensitivity peak at a wavelength of 260 nm) in Example 1.
Figure 5A:
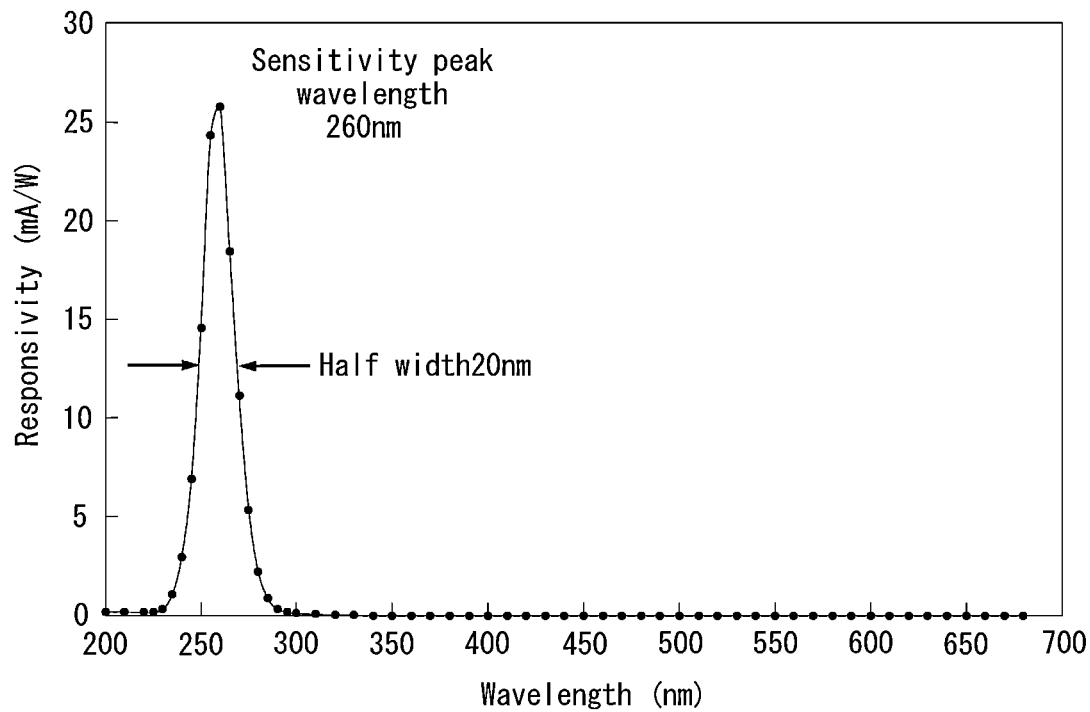
FIG. 5A is a line graph of the wavelength dependence of the responsivity of the ultraviolet light receiving device (having a photosensitivity peak at a wavelength of 260 nm) in Example 1, with its half width.
Figure 5B:
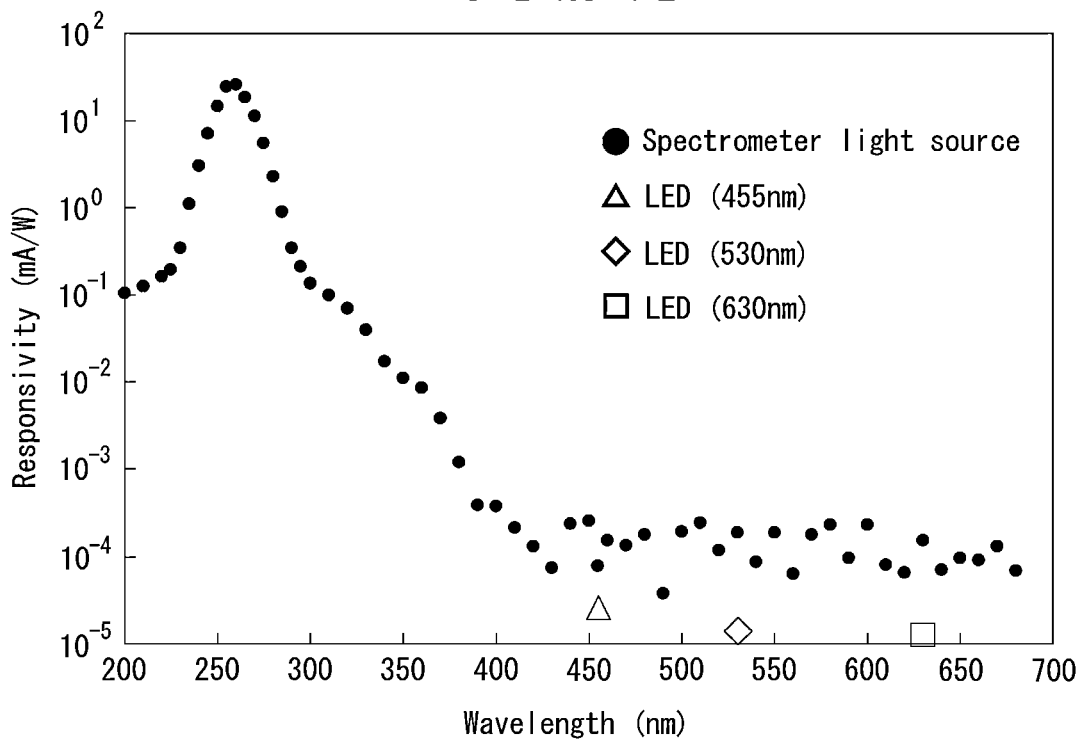
FIG. 5B is a semi-log graph of the wavelength dependence of the responsivity for presenting the rejection ratio of the ultraviolet light receiving device (having a photosensitivity peak at a wavelength of 260 nm) in Example 1 with respect to the visible light region.

FIG. 4 illustrates the I-V characteristics in darkness and in the cases of illuminations with light of 260 nm and visible light of 530 nm. FIG. 5A gives the photosensitivity spectrum illustrating the wavelength dependence of the responsivity in the case where the bias voltage was 0 V. FIG. 5A demonstrates that the photosensitivity peak wavelength was 260 nm and its half width was 20 nm. In this case, the half peak wavelength on the shorter wavelength side was 250 nm. To clearly present the rejection ratio with respect to visible light, the responsivity (vertical axis) in FIG. 5A is represented in a semi-log graph in FIG. 5B. The filled circles (●) represent the wavelength dependence of the responsivity in the case where light from a Xe lamp light source was dispersed to illuminate the sample; besides, the results of the responsivities to 455 nm illumination (open triangle), 530 nm illumination (open rhombus), and 630 nm illumination (open square) using LEDs as light sources are added to FIG. 5B. The open triangle in FIG. 5B corresponds to 1.5 mW illumination, the open rhombus corresponds to 3.3 mW illumination, and the open square corresponds to 6.1 mW illumination. On the other hand, the illumination power of the spectrometer light source was 18.7 μW at 455 nm, 13.0 μW at 530 nm, and 8.5 μW at 630 nm.

The responsivity Rp to the photosensitivity peak wavelength at the filled circle (●) at a bias voltage of 0 V found using the spectrometer light source was 25.8 mA/W, and the average Rv of the responsivity to a visible region of 400 nm or more to 680 nm or less was $1.48 \times 10^{-4}$ mA/W. A calculation using these values resulted in a rejection ratio (Rp/Rv) of $1.74 \times 10^5$ that was a rejection ratio not lower than $10^5$. For reference, the responsivity was lower than that at the filled circles (●) when illumination was from the LEDs with higher output than the Xe lamp light source, which demonstrated that the rejection ratio was at least $10^5$ to $10^6$ or more.

Example 2

An ultraviolet light receiving device with a photosensitivity peak wavelength of 320 nm according to Example 2 was fabricated under the following epitaxial growth conditions. An undoped AlN (0001) layer was grown to 800 nm on a c-plane sapphire substrate. Next, an undoped $Al_{0.70}Ga_{0.30}N$ layer was grown to 1000 nm. Subsequently, a Si-doped n-type $Al_{0.68}Ga_{0.32}N$ layer was grown to 500 nm, and a Si-doped n-type $Al_{0.50}Ga_{0.50}N$ layer for forming ohmic contacts was then gown to 200 nm, and finally an undoped $Al_{0.20}Ga_{0.80}N$ layer was grown to 500 nm, thus an epitaxial substrate for a light receiving device was fabricated. When the chemical proportions of the AlGaN layers in the AlGaN laminate are expressed using the composition ratios (w, x, y, and z) as w=0.70, x=0.68, y=0.50, z=0.20. The other growth conditions were the same as those in Example 1.

Figure 7A:
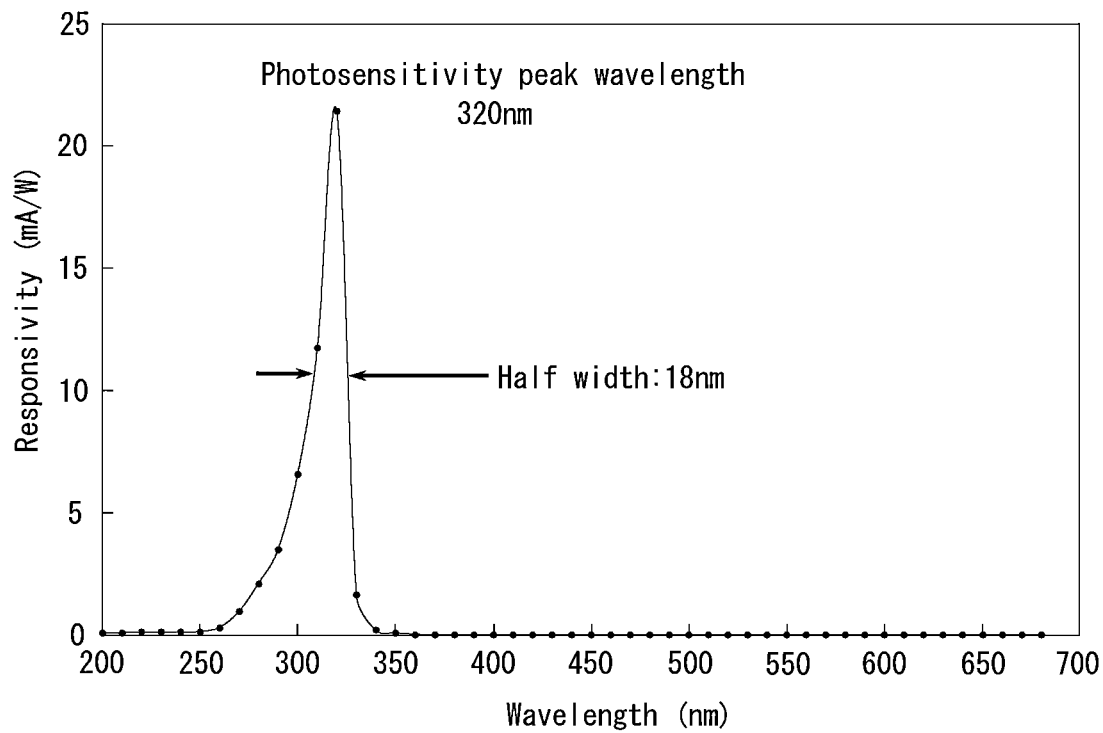
FIG. 7A is a line graph of the wavelength dependence of the responsivity of the ultraviolet light receiving device (having a photosensitivity peak at a wavelength of 320 nm) in Example 2, with its half width.
Figure 7B:
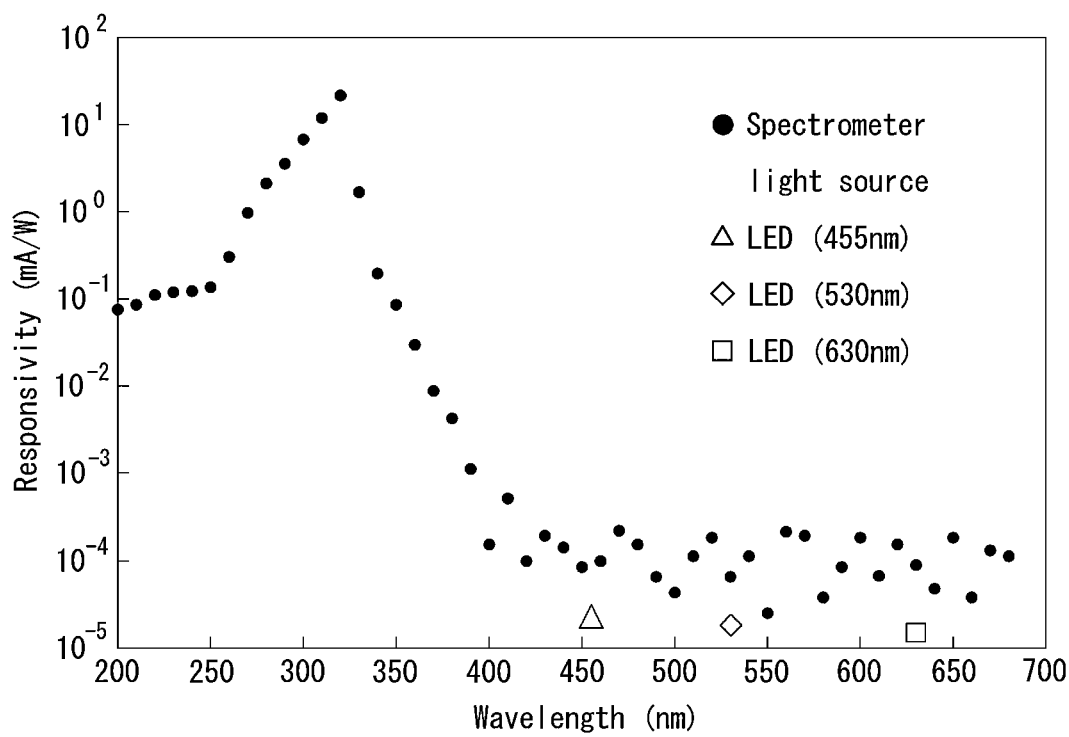
FIG. 7B is a semi-log graph of the wavelength dependence of the responsivity for presenting the rejection ratio of the ultraviolet light receiving device (having a photosensitivity peak at a wavelength of 320 nm) in Example 2 with respect to the visible light region.

Devise processing was performed in the same manner as in Example 1, and the electrical-optical characteristics were evaluated. FIG. 6 illustrates the I-V characteristics in darkness and in the cases of illuminations with light of 320 nm obtained by dispersion of light from the Xe lamp and visible light of 530 nm. FIG. 7A gives the photosensitivity spectrum illustrating the wavelength dependence of the responsivity in the case where the bias voltage was 0 V. FIG. 7A demonstrates that the photosensitivity peak lies at 320 nm. The half width at a bias voltage of 0 V was 18 nm, and the half peak wavelength on the longer wavelength side was 325 nm. Although not illustrated, when the bias voltage was −10 V, the half width was 35 nm, and the half peak wavelength on the longer wavelength side was 335 nm. To present the rejection ratio with respect to visible light, the responsivity is represented in a semi-log graph in FIG. 7B. The filled circles (●) represent the wavelength dependence of the responsivity in the case where light from a Xe lamp light source was dispersed to illuminate the sample and the bias voltage to the light receiving device was 0 V. The results of the responsivities to 455 nm illumination (open triangle), 530 nm illumination (open rhombus), and 630 nm illumination (open square) using LEDs as light sources are added to FIG. 7B. The illumination power of the LED light sources and the spectrometer light source was the same as that in Example 1.

The responsivity Rp to the photosensitivity peak wavelength at the filled circle (●) at a bias voltage of 0 V found using the spectrometer light source was 21.4 mA/W, and the average Rv of the responsivity to a visible region of 400 nm or more to 680 nm or less was $1.29 \times 10^{-4}$ mA/W. A calculation using these values resulted in a rejection ratio (Rp/Rv) of $1.66 \times 10^5$ that was a rejection ratio not lower than $10^5$. For reference, the responsivity was lower than that at the filled circles (●) when illumination was from the LEDs with higher output than the Xe lamp light source, thus the rejection ratio was at least $10^5$ to $10^6$ or more.

Example 3

An ultraviolet light receiving device with a photosensitivity peak wavelength of 230 nm according to Example 3 was fabricated under the following epitaxial growth conditions. Undoped AlN (0001) was grown to 800 nm on a c-plane sapphire substrate. Next, an undoped $Al_{0.95}Ga_{0.05}N$ layer was grown to 1000 nm. Subsequently, a Si-doped n-type $Al_{0.88}Ga_{0.12}N$ layer was grown to 500 nm, and a Si-doped n-type $Al_{0.80}Ga_{0.20}N$ layer for forming ohmic contacts was then gown to 200 nm, and finally an undoped $Al_{0.75}Ga_{0.25}N$ layer was grown to 300 nm, thus an epitaxial substrate for a light receiving device was fabricated. When the chemical proportions of the AlGaN layers in the AlGaN laminate are expressed using the composition ratios (w, x, y, and z) as w=0.95, x=0.88, y=0.80, z=0.75. The other growth conditions were the same as those in Example 1.

Figure 8:
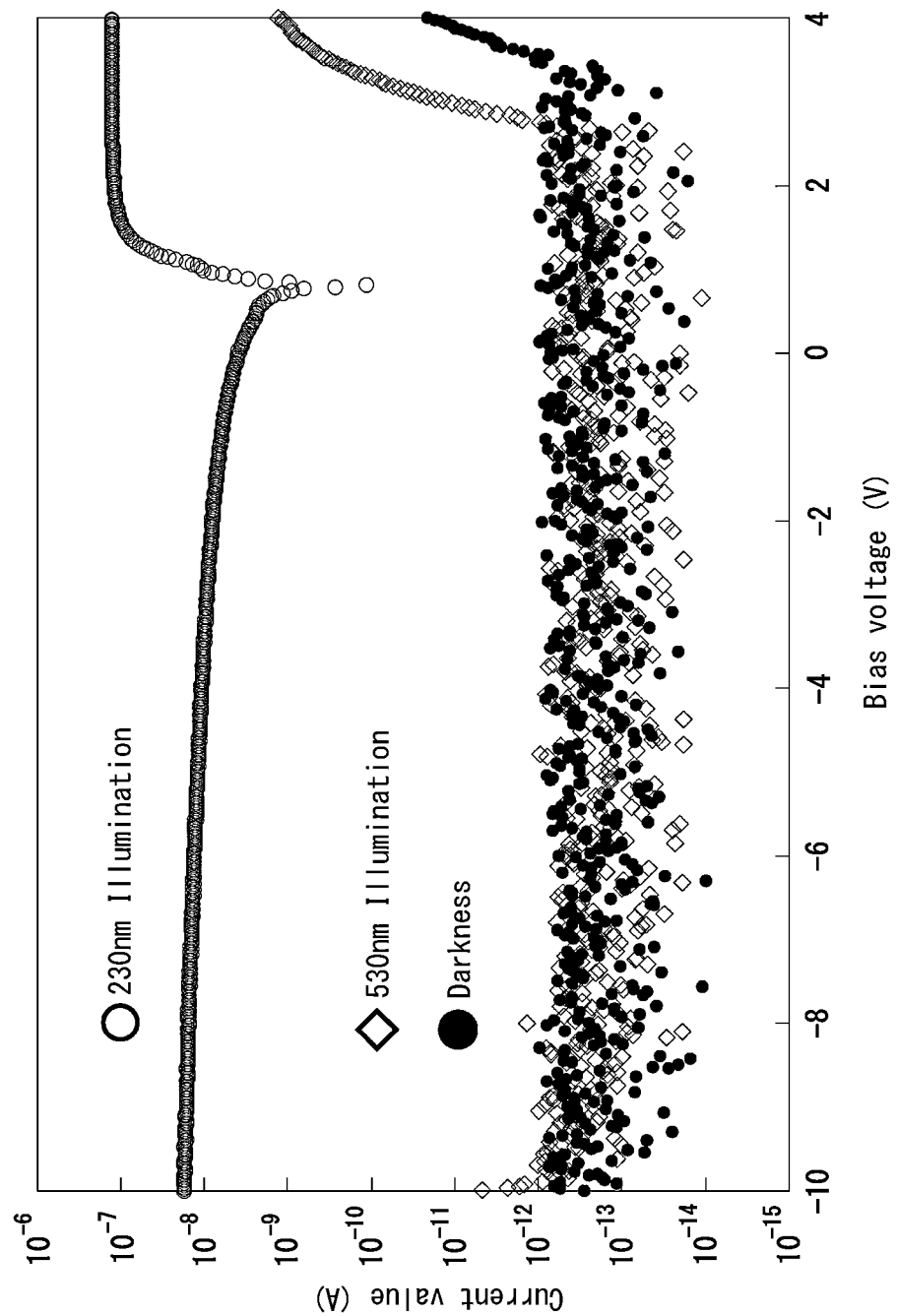
FIG. 8 is a graph presenting the I-V characteristics of an ultraviolet light receiving device (having a photosensitivity peak at a wavelength of 230 nm) in Example 3.
Figure 9A:
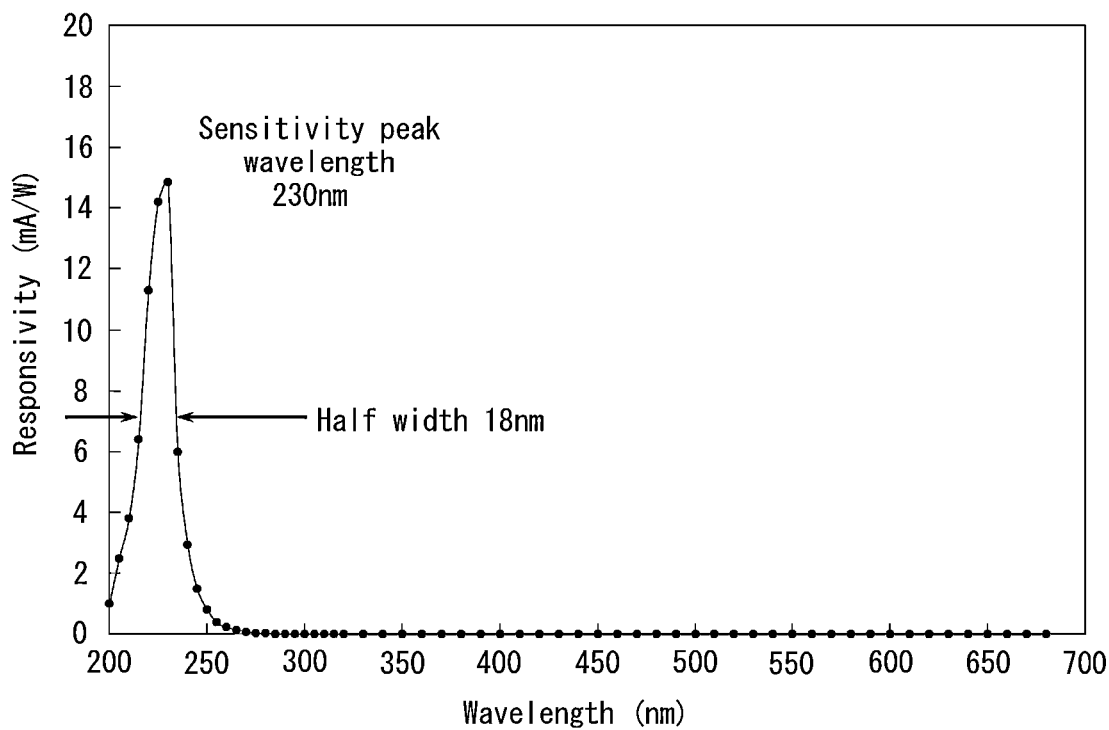
FIG. 9A is a line graph of the wavelength dependence of the responsivity of the ultraviolet light receiving device (having a photosensitivity peak at a wavelength of 230 nm) in Example 3, with its half width.
Figure 9B:
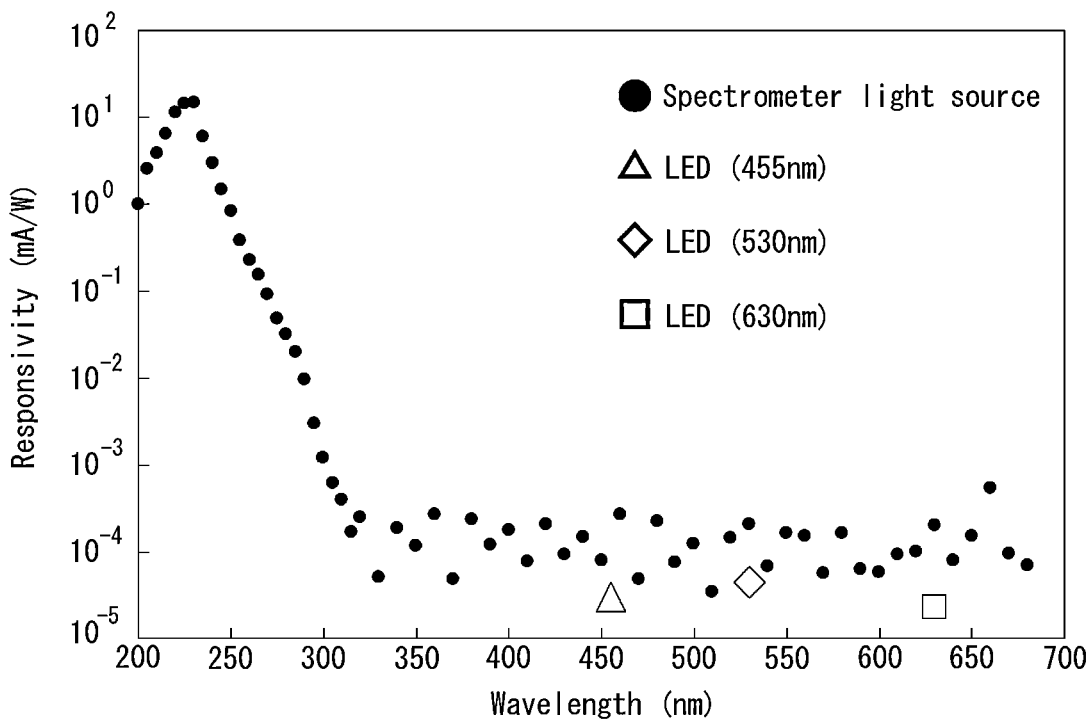
FIG. 9B is a semi-log graph of the wavelength dependence of the responsivity for presenting the rejection ratio of the ultraviolet light receiving device (having a photosensitivity peak at a wavelength of 230 nm) in Example 3 with respect to the visible light region.

Devise processing was performed in the same manner as in Example 1, and the electrical-optical characteristics were evaluated. FIG. 8 illustrates the I-V characteristics in darkness and in the cases of illuminations with light of 230 nm obtained by dispersion of light from the Xe lamp and light of 530 nm. FIG. 9A gives the photosensitivity spectrum illustrating the wavelength dependence of the responsivity in the case where the bias voltage was 0 V. FIG. 9A demonstrates that the photosensitivity peak lies at 230 nm. In this case, the half width was 18 nm, and the half peak wavelength on the shorter wavelength side was 216 nm. To present the rejection ratio with respect to visible light, the responsivity is represented in a semi-log graph in FIG. 9B. The filled circles (●) represent the wavelength dependence of the responsivity in the case where light from a Xe lamp light source was dispersed to illuminate the sample and the bias voltage to the light receiving device was 0 V. The results of the responsivities to 455 nm illumination (open triangle), 530 nm illumination (open rhombus), and 630 nm illumination (open square) using LEDs as light sources are added to FIG. 9B. The illumination power of the LED light sources and the spectrometer light source was the same as that in Example 1.

The responsivity Rp to the photosensitivity peak wavelength at the filled circle (●) at a bias voltage of 0 V found using the spectrometer light source was 14.8 mA/W, and the average Rv of the responsivity to a visible region of 400 nm or more to 680 nm or less was $1.37 \times 10^{-4}$ mA/W. A calculation using these values resulted in a rejection ratio (Rp/Rv) of $1.08 \times 10^5$ that was a rejection ratio not lower than $10^5$. For reference, the responsivity was lower than that at the filled circles (●) when illumination was from the LEDs with higher output than the Xe lamp light source, thus the rejection ratio was at least $10^5$ to $10^6$ or more.

Comparative Example 1

The specific ultraviolet wavelengths light receiving device S12742-254 manufactured by HAMAMATSU PHOTONICS K.K., in which an ultraviolet light band-pass filter is attached to a Si light receiving device has photosensitivity corresponding to germicidal rays (254 nm) from a mercury lamp. This being the case, the I-V characteristics in darkness and in the cases of illuminations with light of 254 nm obtained by dispersion of light from the Xe lamp and visible light of a range of 400 nm to 680 nm using the device were measured. FIG. 10 gives the measurement results. The dark current was at a level close to the detection limit for the evaluation system; however, a considerable amount of photocurrent flows during visible light illumination (400 nm to 680 nm), and differed from the current value during 254 nm illumination by only approximately two orders of magnitude. FIG. 11 presents the wavelength dependence of the responsivity, and the rejection ratio with respect to visible light was in the middle on the order of $10^2$ (at least more than $10^2$ and less than $10^3$). The photosensitivity peak was 254 nm, and the half width was 13 nm.

Comparative Example 2

In Examples 1 to 3, the illumination was performed from the sapphire substrate side, whereas illumination was performed from the light receiving layer surface side using the light receiving device used in Examples and the electrical-optical characteristics were evaluated in Comparative Examples 2-1 to 2-3 below.

Comparative Example 2-1

Figure 12A:
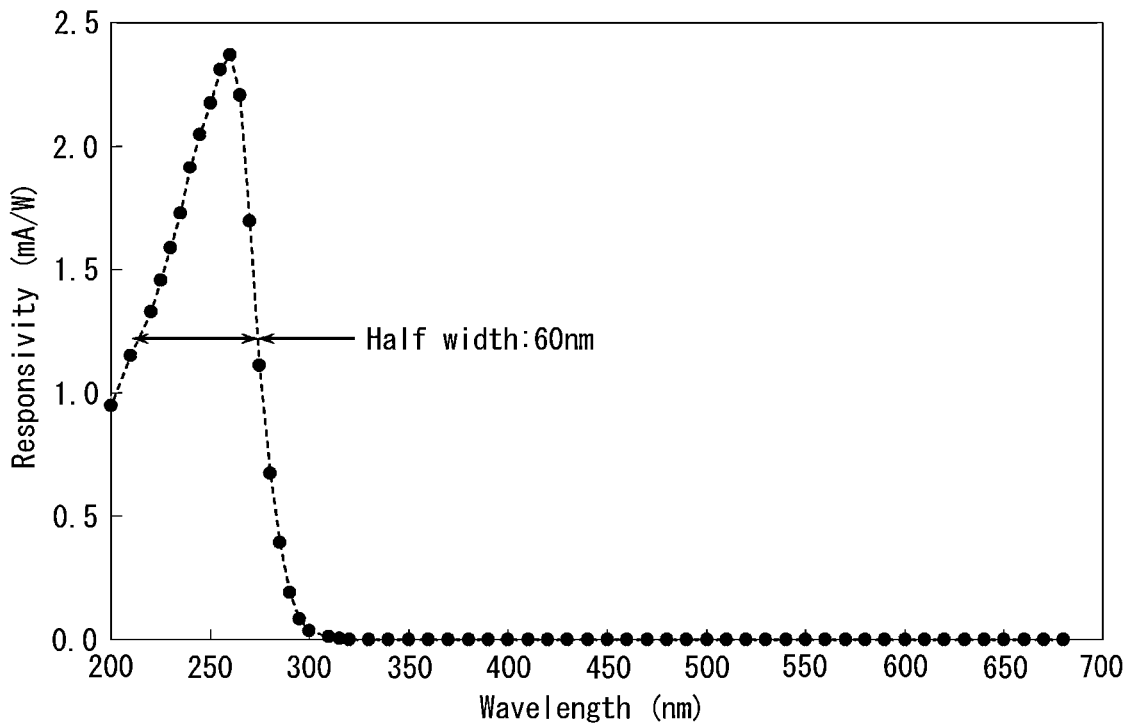
FIG. 12A is a line graph of the wavelength dependence of the responsivity of the ultraviolet light receiving device (having a photosensitivity peak at a wavelength of 260 nm) to illumination from the light receiving layer side in Comparative Example 2-1, with its half width.
Figure 12B:
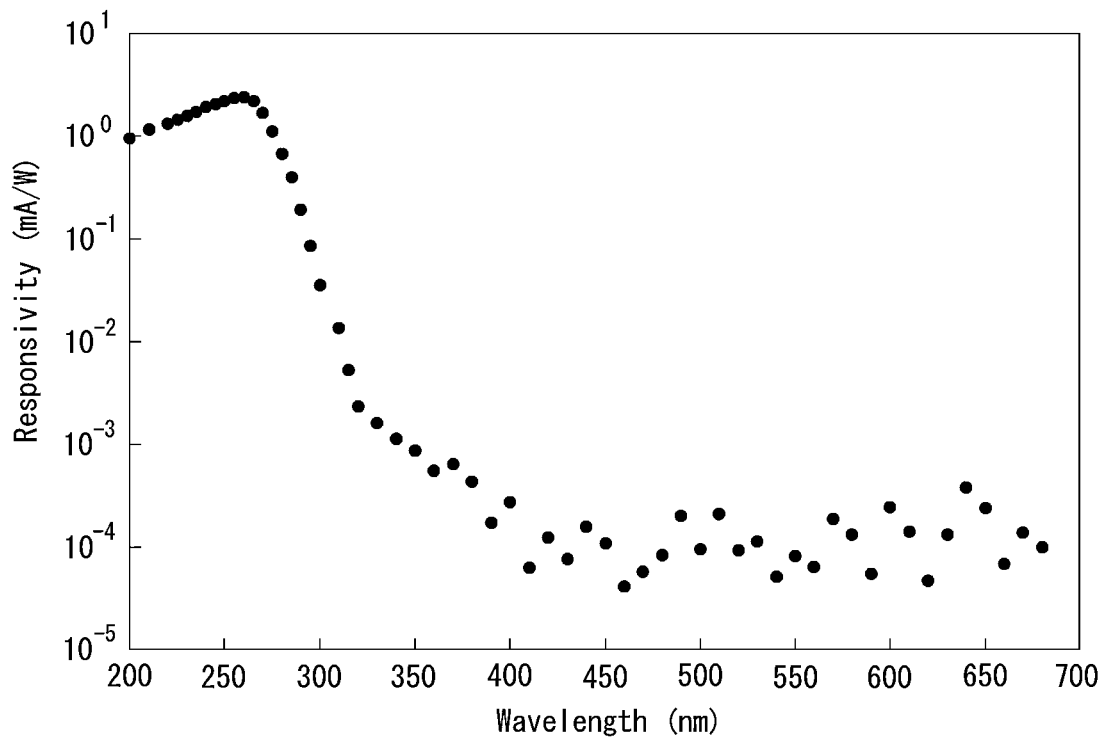
FIG. 12B is a semi-log graph illustrating the wavelength dependence of the responsivity of the ultraviolet light receiving device (having a photosensitivity peak at a wavelength of 260 nm) in Comparative Example 2-1, for presenting the rejection ratio with respect to the visible light region of illumination from the light receiving layer side.

In Comparative Example 2-1, illumination was performed on the device having photosensitivity to 260 nm in Example 1 from the light receiving layer surface side. FIG. 12A is a line graph of the wavelength dependence of the responsivity when illumination was performed through the Schottky electrode on the light receiving layer side, illustrating a case where the bias voltage was 0 V. The half width of the responsivity was 60 mm, and the device had photosensitivity that extends over wavelengths shorter than that of the photosensitivity peak and had an asymmetric spectral shape. FIG. 12B is a semi-log graph of the responsivity for presenting the rejection ratio with respect to visible light.

The responsivity Rp to the photosensitivity peak wavelength at the filled circle (●) at a bias voltage of 0 V was 2.37 mA/W, and the average Rv of the responsivity to a visible region of 400 nm or more to 680 nm or less was $1.29 \times 10^{-4}$ mA/W, and the rejection ratio (Rp/Rv) calculated was $1.84 \times 10^4$ that was a rejection ratio of less than $10^5$.

Comparative Example 2-2

Figure 13A:
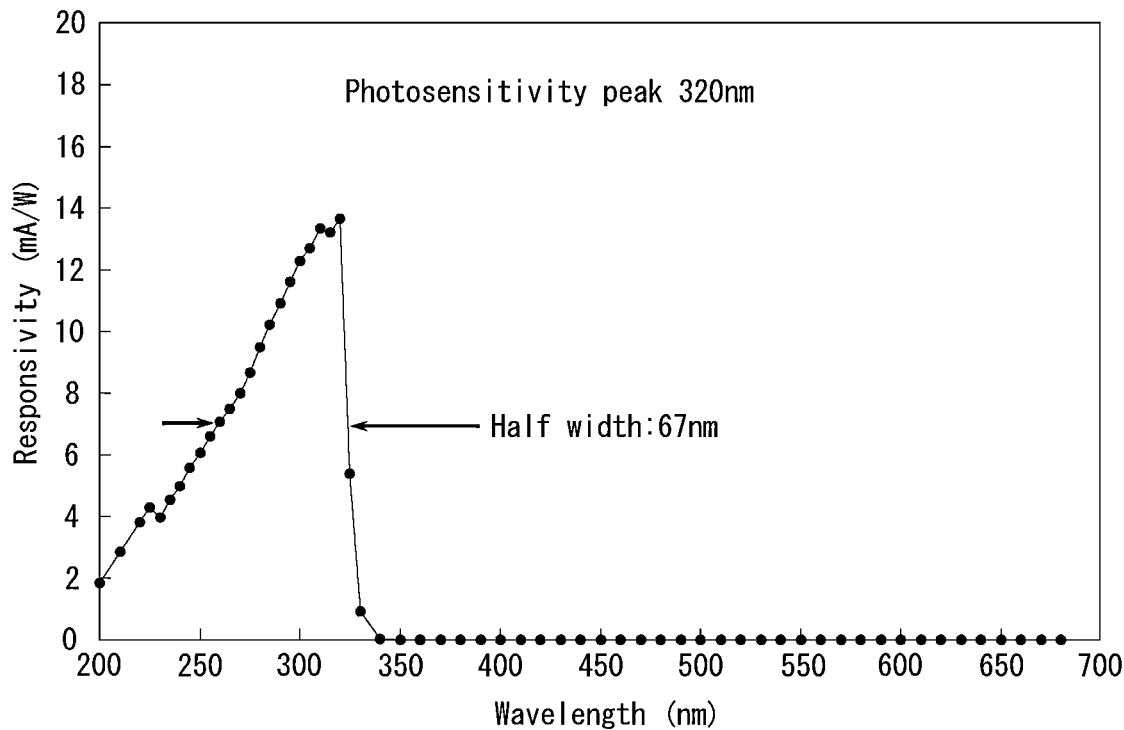
FIG. 13A is a line graph of the wavelength dependence of the responsivity of the ultraviolet light receiving device (having a photosensitivity peak at a wavelength of 320 nm) to illumination from the light receiving layer side in Comparative Example 2-2, with its half width.
Figure 13B:
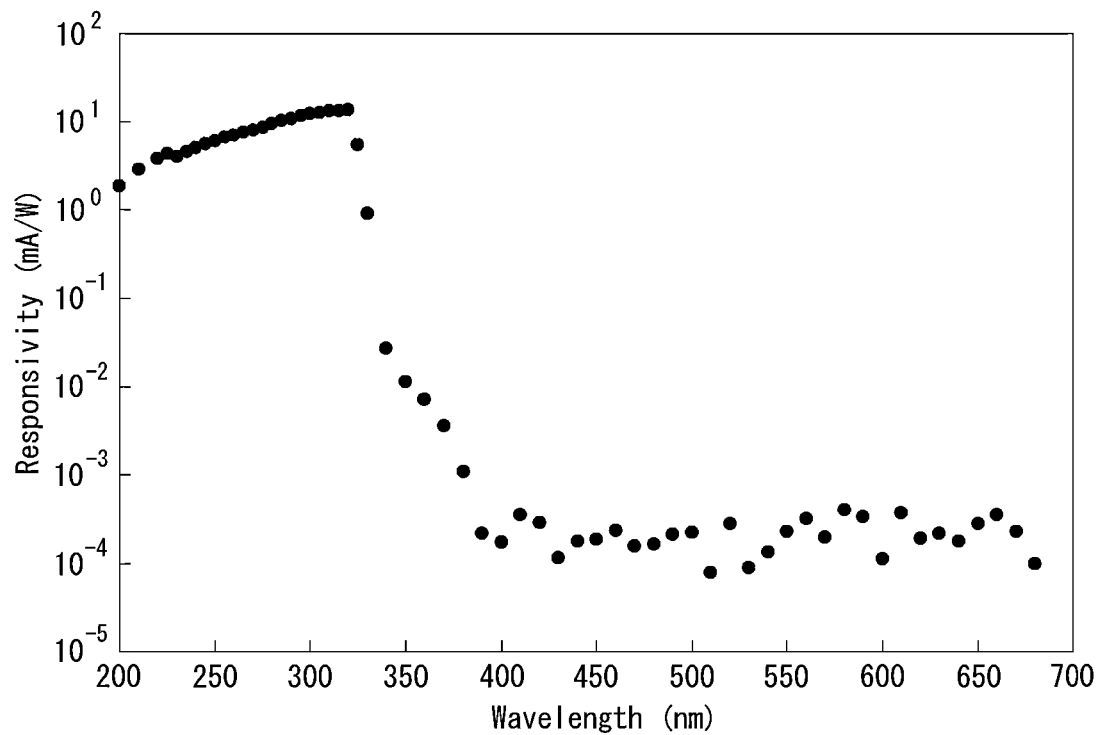
FIG. 13B is a semi-log graph illustrating the wavelength dependence of the responsivity of the ultraviolet light receiving device (having a photosensitivity peak at a wavelength of 320 nm) in Comparative Example 2-2, for presenting the rejection ratio with respect to the visible light region of illumination from the light receiving layer side.

In Comparative Example 2-2, the device having the photosensitivity peak at 320 nm, used in Example 2 was subjected to illumination from the light receiving layer side through the Schottky electrode. FIG. 13A is a line graph of the wavelength dependence of the responsivity, illustrating a case where the bias voltage was 0 V, and the half width of the photosensitivity was 67 nm. Also in this case, the sensitivity greatly extends over wavelengths shorter than the photosensitivity peak wavelength and had an asymmetric spectral shape. FIG. 13B is a semi-log graph of the responsivity for presenting the rejection ratio with respect to visible light.

The responsivity Rp to the photosensitivity peak wavelength at the filled circle (●) at a bias voltage of 0 V was 13.7 mA/W, and the average Rv of the responsivity to a visible region of 400 nm or more to 680 nm or less was $2.20 \times 10^{-4}$ mA/W, and the rejection ratio (Rp/Rv) calculated was $6.23 \times 10^4$ that was a rejection ratio of less than $10^5$.

Comparative Example 2-3

Figure 14A:
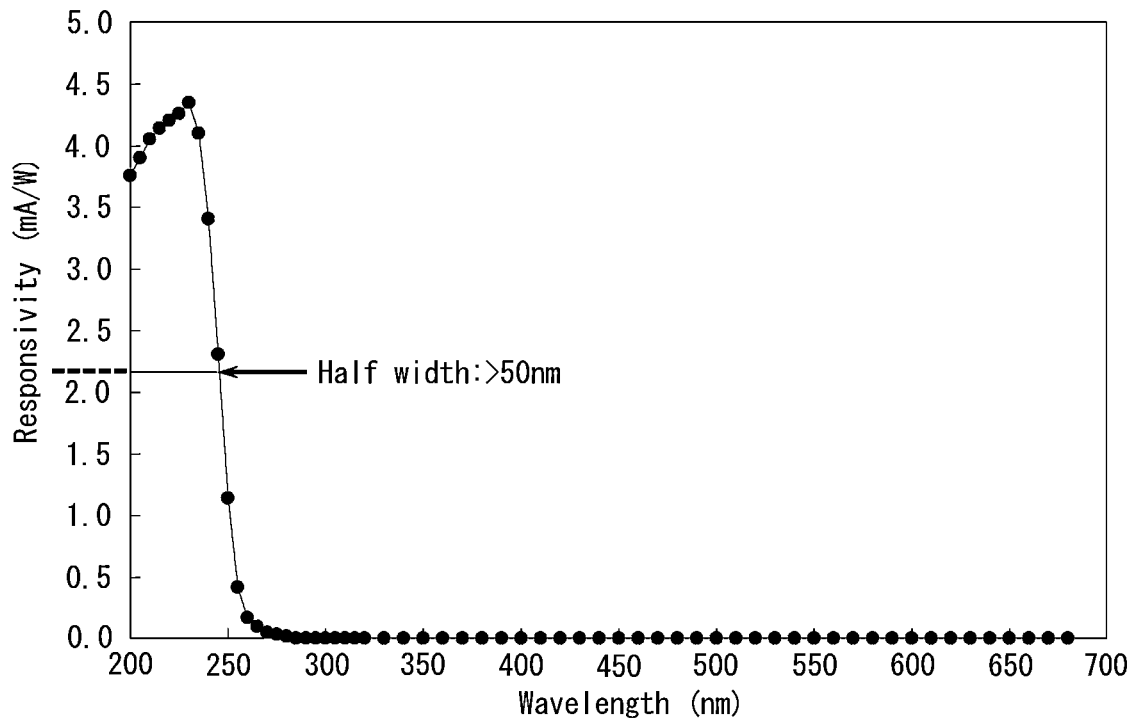
FIG. 14A is a line graph of the wavelength dependence of the responsivity of the ultraviolet light receiving device (having a photosensitivity peak at a wavelength of 230 nm) to illumination from the light receiving layer side in Comparative Example 2-3, with its half width.
Figure 14B:
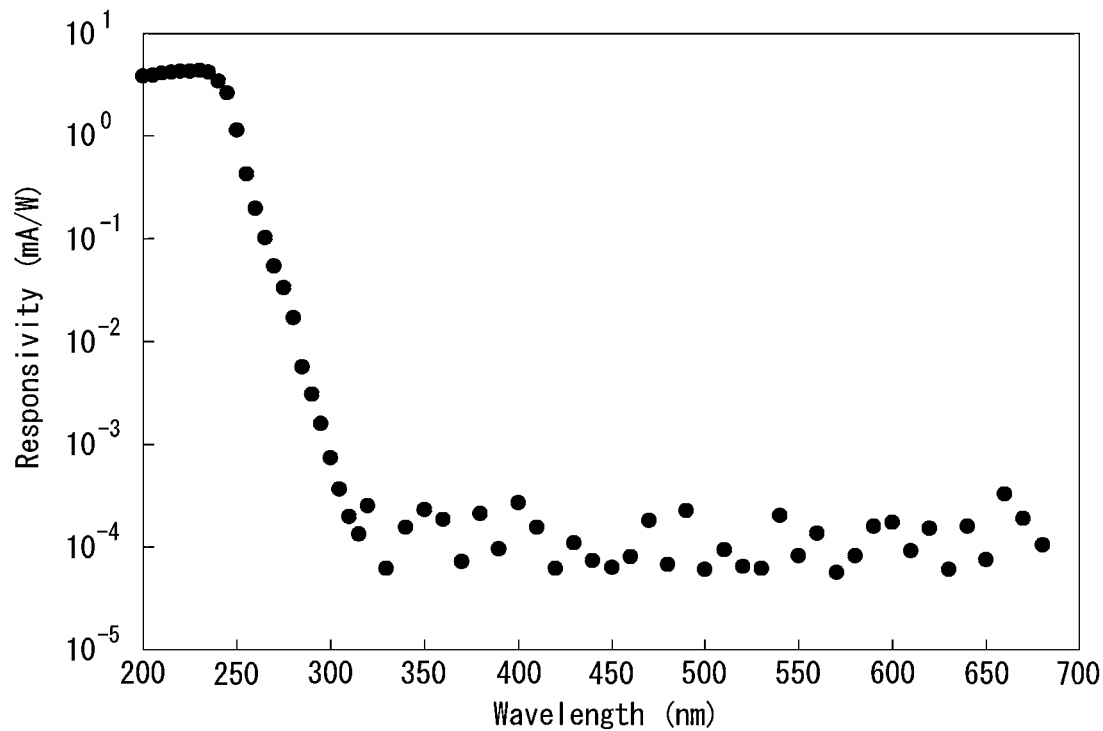
FIG. 14B is a semi-log graph illustrating the wavelength dependence of the responsivity of the ultraviolet light receiving device (having a photosensitivity peak at a wavelength of 230 nm) in Comparative Example 2-3, for presenting the rejection ratio with respect to the visible light region of illumination from the light receiving layer side.

In Comparative Example 2-3, the device having the photosensitivity peak at 230 nm, used in Example 3 was subjected to illumination from the light receiving layer side through the Schottky electrode. FIG. 14A is a line graph of the wavelength dependence of the responsivity, illustrating a case where the bias voltage was 0 V. For wavelengths less than 200 nm, the responsivity could not be determined because the illumination power was out of the measurement range; however, since the half peak wavelength on the longer wavelength side was 245 nm, the half width was fully found to have been at least more than 50 nm. Also in this case, the sensitivity greatly extends over wavelengths shorter than the photosensitivity peak wavelength and had an asymmetric spectral shape. FIG. 14B is a semi-log graph of the responsivity for presenting the rejection ratio with respect to visible light.

The responsivity Rp to the photosensitivity peak wavelength at the filled circle (●) at a bias voltage of 0 V was 4.35 mA/W, and the average Rv of the responsivity to a visible region of 400 nm or more to 680 nm or less was $1.25 \times 10^{-4}$ mA/W, and the rejection ratio (Rp/Rv) calculated was $3.84 \times 10^4$ that was a rejection ratio of less than $10^5$.

The measurement results of Examples 1 to 3 and Comparative Examples 2-1 to 2-3 above are summarized in Table 1.

TABLE 1

|  | Peak wavelength (nm) | Half width (nm) | Responsivity Rp to photosensitivity peak wavelength (mA/W) | Average Rv of responsivity to visible region (mA/W) | Rejection ratio (Rp/Rv) |
|---|---|---|---|---|---|
| Example 1 | 260 | 20 | 25.8 | $1.48 \times 10^{-4}$ | $1.74 \times 10^5$ |
| Example 2 | 320 | 18 | 21.4 | $1.29 \times 10^{-4}$ | $1.66 \times 10^5$ |
| Example 3 | 230 | 18 | 14.8 | $1.37 \times 10^{-4}$ | $1.08 \times 10^5$ |
| Comparative Example 2-1 | 260 | 60 | 2.37 | $1.29 \times 10^{-4}$ | $1.84 \times 10^4$ |

TABLE 1-continued

|  | Peak wavelength (nm) | Half width (nm) | Responsivity Rp to photosensitivity peak wavelength (mA/W) | Average Rv of responsivity to visible region (mA/W) | Rejection ratio (Rp/Rv) |
|---|---|---|---|---|---|
| Comparative Example 2-2 | 320 | 67 | 13.7 | $2.20 \times 10^{-4}$ | $6.23 \times 10^{4}$ |
| Comparative Example 2-3 | 230 | >50 | 4.35 | $1.25 \times 10^{-4}$ | $3.84 \times 10^{4}$ |

Table 1 above demonstrates that when illumination is performed from the sapphire substrate side using an AlGaN laminate according to the embodiments of this disclosure, a rejection ratio of $10^5$ or higher with respect to the responsivity to the visible region can be obtained, and light of specific wavelengths with a half width of 40 nm or less can exclusively be detected.

INDUSTRIAL APPLICABILITY

An ultraviolet light receiving device according to this disclosure can exclusively detect light of the target ultraviolet wavelengths without being disturbed by visible light or near ultraviolet light. An ultraviolet light receiving device that exclusively detects light of those specific wavelengths can be used in pair with a light emitting device for disinfection applications, medical applications, analysis applications, etc. in output monitors and feedback control, and thus are very useful.

REFERENCE SIGNS LIST

11: Sapphire substrate
12: AlN layer
13: $Al_wGa_{1-w}N$ buffer layer
14: n-type $Al_xGa_{1-x}N$ current spreading layer
15: n-type $Al_yGa_{1-y}N$ ohmic contact layer
16: $Al_zGa_{1-z}N$ light receiving layer
20: Isolation groove
21: n-type electrode
23: Schottky electrode

The invention claimed is:

1. A Schottky ultraviolet light receiving device configured to have a peak photosensitivity wavelength in an ultraviolet region of 230 nm or more and 320 nm or less,
   wherein a rejection ratio that is a ratio of a responsivity Rp to the peak photosensitivity wavelength to an average of responsivity Rv to a visible region of 400 nm or more and 680 nm or less (Rp/Rv) is $10^5$ or more,
   the Schottky ultraviolet light receiving device comprises an AlN layer on a sapphire substrate and an AlGaN laminate made up of a plurality of AlGaN layers having different Al composition ratios on the AlN layer,
   wherein the AlGaN laminate has an $Al_wGa_{1-w}N$ buffer layer ($0.5 \leq w \leq 0.95$) and an $Al_zGa_{1-z}N$ light receiving layer in this order from the AlN layer side;
   the values of the Al composition ratios satisfy a relationship of $z<w$;
   the AlGaN laminate has an n-type $Al_xGa_{1-x}N$ current spreading layer and an n-type $Al_yGa_{1-y}N$ ohmic contact layer in this order from the AlN layer side between the $Al_wGa_{1-w}N$ buffer layer and the $Al_zGa_{1-z}N$ light receiving layer;
   the values of the Al composition ratios satisfy a relationship of $z \leq y < x \leq w$;
   illumination light for measuring the responsivity enters through the sapphire substrate; and
   a half width of a photosensitivity spectrum of the ultraviolet light receiving device is 40 nm or less.

2. The ultraviolet light receiving device according to claim 1,
   wherein the $Al_zGa_{1-z}N$ light receiving layer has an etched portion where the n-type $Al_yGa_{1-y}N$ ohmic contact layer is exposed,
   an n-type ohmic electrode is provided on the exposed n-type $Al_yGa_{1-y}N$ ohmic contact layer, and
   a Schottky electrode is placed on the $Al_zGa_{1-z}N$ light receiving layer.

* * * * *